(12) United States Patent
Dahlen et al.

(10) Patent No.: US 12,732,217 B2
(45) Date of Patent: Sep. 8, 2026

(54) TECHNIQUES FOR DIMINISHING LATENCY IN A DISTRIBUTED ANTENNA SYSTEM

(71) Applicant: outdoor Wireless Networks LLC, Claremont, NC (US)

(72) Inventors: Theodore E. Dahlen, Burnsville, MN (US); Christopher Goodman Ranson, Concord, VA (US)

(73) Assignee: Outdoor Wireless Networks LLC, Richardson, TX (US)

( * ) Notice: Subject to any disclaimer, the term of this patent is extended or adjusted under 35 U.S.C. 154(b) by 529 days.

(21) Appl. No.: 18/325,733

(22) Filed: May 30, 2023

(65) Prior Publication Data

US 2024/0007138 A1 Jan. 4, 2024

Related U.S. Application Data

(60) Provisional application No. 63/484,337, filed on Feb. 10, 2023, provisional application No. 63/358,034, filed on Jul. 1, 2022.

(51) Int. Cl.

| | |
|---|---|
| ***H04B 1/04*** | (2006.01) |
| ***H03H 17/02*** | (2006.01) |
| ***H03H 21/00*** | (2006.01) |

(52) U.S. Cl.

CPC ....... *H04B 1/0458* (2013.01); *H03H 17/0202* (2013.01); *H03H 21/0012* (2013.01)

(58) Field of Classification Search

CPC ............ H04B 1/0458; H03H 17/0202; H03H 21/0012

USPC ........................................................ 455/552.1

See application file for complete search history.

(56) References Cited

U.S. PATENT DOCUMENTS

| | | | | |
|---|---|---|---|---|
| 2012/0314797 | A1* | 12/2012 | Kummetz | H04L 27/34 375/295 |
| 2017/0257151 | A1 | 9/2017 | Lange | |
| 2018/0116012 | A1 | 4/2018 | Kim et al. | |
| 2019/0341970 | A1* | 11/2019 | Lange | H04L 12/46 |
| 2020/0076567 | A1* | 3/2020 | Wala | G06F 12/1009 |
| 2020/0336278 | A1* | 10/2020 | Ashworth | H04W 88/08 |
| 2021/0100066 | A1* | 4/2021 | Braun | H04W 88/085 |
| 2024/0314668 | A1* | 9/2024 | Stapleton | H04W 24/04 |

OTHER PUBLICATIONS

A Fixed-Latency Architecture to Secure GOOSE and Sampled Value Messages in Substation Systems; Mikel Rodríguez; IEEE; Apr. 2021 (Year: 2021).*

Eidson, John, "IEEE-1588 Standard for a Precision Clock Synchronization Protocol for Networked Measurement and Control Systems—a Tutorial-", Oct. 10, 2005, Agilent Technologies, pp. 1 through 94, (c) 2005, Agilent Technologies.

(Continued)

*Primary Examiner* — Hirdepal Singh

(74) *Attorney, Agent, or Firm* — Fogg & Powers LLC

(57) ABSTRACT

Techniques are provided for diminishing latency in a DAS fronthaul network configured to convey time-domain transport data, e.g., time-domain digital transport data or time-domain digital data. Other techniques are provided for obtaining higher DAS fronthaul efficiency.

13 Claims, 17 Drawing Sheets

(56) References Cited

OTHER PUBLICATIONS

Eidson, John, "IEEE-1588 Standard Version 2—a Tutorial-", Oct. 2, 2006, Agilent Technologies, pp. 1 through 21, (c) 2006, Agilent Technologies.
International Searching Authority, "International Search Report and Written Opinion", from PCT Application No. PCT/US2023/023876, from Foreign Counterpart to U.S. Appl. No. 18/325,733, filed Nov. 2, 2023, pp. 1 through 11, Published in: WO.
Rodriguez et al, "A Fixed-Latency Architecture to Secure GOOSE and Sampled Value Messages in Substation Systems", IEEEAccess, vol. 9, Apr. 8, 2021, 9, pp. 51646 through 51658.
The Consultative Committee for Space Data Systems (CCSDS). "Encapsulation Service", Recommended Standard, CCSDS 133.1-B-2, Blue Book, Oct. 2009, Page(s) Cover through C-3.

* cited by examiner

TECHNIQUES FOR DIMINISHING LATENCY IN A DISTRIBUTED ANTENNA SYSTEM

CROSS-REFERENCE TO RELATED APPLICATIONS

The present application claims benefit of U.S. Patent Application Ser. No. 63/358,034, filed Jul. 1, 2022, and of U.S. Patent Application Ser. No. 63/484,337 filed Feb. 10, 2023; the entire contents of each of the aforementioned patent applications are incorporated herein by reference as if set forth in their entirety.

BACKGROUND

A distributed antenna system (DAS) typically includes one or more central units or nodes (also referred to here as “central access nodes (CANs)” or “master units”) that are communicatively coupled to a plurality of remotely located access points or antenna units (also referred to here as “remote units”), where each access point can be coupled directly to one or more of the central access nodes or indirectly via one or more other remote units and/or via one or more intermediary or expansion units or nodes (also referred to here as “transport expansion nodes (TENs)”). A DAS is typically used to improve the coverage provided by one or more base stations that are coupled to the central access nodes. These base stations can be coupled to the one or more central access nodes via one or more cables or via a wireless connection, for example, using one or more donor antennas. The wireless service provided by the base stations can include commercial cellular service and/or private or public safety wireless communications.

In general, each central access node receives one or more downlink signals from one or more base stations and generates one or more downlink transport signals derived from one or more of the received downlink base station signals. Each central access node transmits one or more downlink transport signals to one or more of the access points. Each access point receives the downlink transport signals transmitted to it from one or more central access nodes and uses the received downlink transport signals to generate one or more downlink radio frequency signals that are radiated from one or more coverage antennas associated with that access point. The downlink radio frequency signals are radiated for reception by user equipment (UEs). Typically, the downlink radio frequency signals associated with each base station are simulcasted from multiple remote units. In this way, the DAS increases the coverage area for the downlink capacity provided by the base stations.

Likewise, each access point receives one or more uplink radio frequency signals transmitted from the user equipment. Each access point generates one or more uplink transport signals derived from the one or more uplink radio frequency signals and transmits them to one or more of the central access nodes. Each central access node receives the respective uplink transport signals transmitted to it from one or more access points and uses the received uplink transport signals to generate one or more uplink base station radio frequency signals that are provided to the one or more base stations associated with that central access node. Typically, this involves, among other things, summing uplink signals received from all of the multiple access points in order to produce the base station signal provided to each base station. In this way, the DAS increases the coverage area for the uplink capacity provided by the base stations.

A DAS can use either digital transport, analog transport, or combinations of digital and analog transport for generating and communicating the transport signals between the central access nodes, the access points, and any transport expansion nodes.

When digital transport has traditionally been used in a DAS, the various nodes of a DAS have been coupled to each other using synchronous, point-to-point links and data has been transported in a time-domain form. The time-domain form of such data is also referred to here as using “option 8” for the functional split (for example, between a baseband unit (BBU) and remote radio head (RRH)) or simply “split 8.” Approaches used with such split 8 implementations may have shortcomings when used when the nodes of a DAS are coupled to each other in other ways (for example, using a switched Ethernet network). Moreover, the O-RAN Alliance has developed an open, standardized fronthaul interface that is suitable for use in implementing distributed base station topologies using switched Ethernet networks as the fronthaul. (“O-RAN” is an acronym for “Open RAN.”) The O-RAN fronthaul interface was designed primarily for use with user-plane data that is communicated in frequency-domain form. Communicating data in user-plane data in frequency-domain form reduces the amount of bandwidth used (relative to communicating data in time-domain form). However, the framing and packet formation structure of the O-RAN fronthaul interface contains additional complexity (due in part to it being designed primarily for use with user-plane data that is communicated in frequency-domain form). The O-RAN fronthaul interface does support communicating data in time-domain form; however, using the O-RAN fronthaul interface to communicate data in time-domain form incurs the burden of the additional complexity relating to the framing and packet formation structure used by the O-RAN fronthaul interface.

SUMMARY OF THE INVENTION

A distributed antenna system (DAS) serving a base station is provided. The distributed antenna system comprises: a donor card configured to couple the base station to the DAS and to communicate time-domain digital data therebetween; a plurality of radio units (RUs); and a switched Ethernet network coupling the plurality of RUs and the donor card; wherein the DAS is configured so that the time-domain digital data is communicated over the switched Ethernet network in packets having a fixed latency, wherein packet size varies as a function of carrier bandwidth.

A distributed antenna system (DAS) serving a base station is provided. The distributed antenna system comprises: a donor card configured to couple the base station to the DAS and to communicate time-domain digital data therebetween; and a plurality of radio units (RUs) coupled to the donor card via a switched Ethernet network; wherein at least one of the donor card and each of the plurality of RUs each comprise a fractional resampler supporting run-time changes of a re-sampling ratio based upon carrier bandwidth of data.

A distributed antenna system (DAS) serving a base station is provided. The distributed antenna system comprises: a donor card configured to couple the base station to the DAS and to communicate time-domain digital data therebetween; a master unit configured to couple an open radio access network (O-RAN) distributed unit to the DAS and to communicate O-RAN data therebetween; at least one intermediate combining node (ICN); a plurality of radio units (RUs) coupled to the master unit through the ICN; a switched Ethernet network; and wherein the plurality of RUs, the master unit, ICN, and RUs are coupled to each other via the switched Ethernet network; wherein the ICN is configured to fragment the O-RAN data and combine fragments of the O-RAN data with the time-domain digital data and communicate the combined data to RUs.

A method for defining a packet layout template is provided. The method comprises: receiving a list of carrier-antenna configurations whose data is to be transmitted within a distributed antenna system (DAS), and a bandwidth of each carrier; determining a number of blocks of data of the packet layout template using the bandwidth of each carrier and a number of antenna ports of each carrier; using the number of blocks, creating the packet layout template including at least one block, wherein a number of the at least one block equals a maximum transmission unit (MTU) level or a number of blocks so that there are not remaining blocks to place in the packet layout template; assigning a unique packet layout identifier to the packet layout template; determining whether all blocks have been included in at least one packet layout template; and determining that all of the blocks have been included in the at least one packet layout template, then transferring each packet layout template and corresponding packet layout identifier to each component of the DAS configured to at least one of: construct packets according to each packet layout template and to extract the data from each packet formed according to a packet layout template.

BRIEF DESCRIPTION OF DRAWINGS

Comprehension of embodiments of the invention is facilitated by reading the following detailed description in conjunction with the annexed drawings, in which.

DETAILED DESCRIPTION

Some embodiments of inventions herein are directed to techniques for diminishing latency in a DAS fronthaul network configured to convey time-domain transport data, e.g., time-domain digital transport data or time-domain digital data. This is beneficial when the DAS is coupled to one or more radio frequency interface base station(s) and/or a common public radio interface (CPRI) (or similar) fronthaul interface which do not permit compensation for DAS fronthaul latency. Some embodiments of the inventions herein are directed to techniques for obtaining higher DAS fronthaul efficiency by maintaining a fixed latency which does not depend upon carrier bandwidth, and techniques for implementing packets therefore.

Exemplary DASs will now be described. However, DASs may be implemented in other configurations.

Figure 1A:
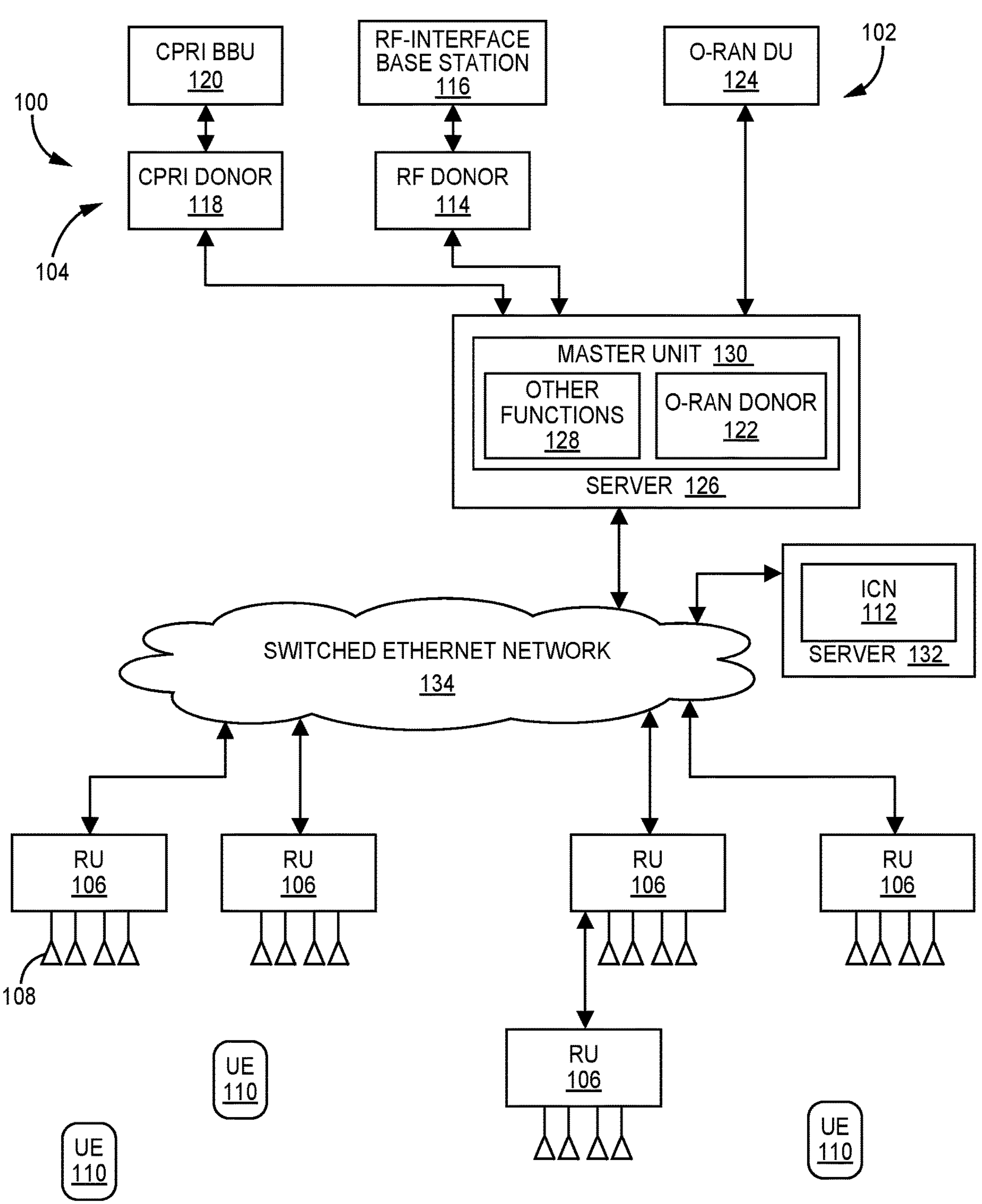
FIG. 1A is a block diagram illustrating an exemplary embodiment of a distributed antenna system (DAS) that is configured to serve one or more base stations.

FIG. 1A is a block diagram illustrating an exemplary embodiment of a distributed antenna system (DAS) 100 that is configured to serve one or more base stations 102. In the exemplary embodiment shown in FIG. 1A, the DAS 100 includes one or more donor units 104 that are used to couple the DAS 100 to the base stations 102. The DAS 100 also includes a plurality of remotely located radio units (RUs) 106 (also referred to as "antenna units," "access points," "remote units," or "remote antenna units"). The RUs 106 are communicatively coupled to the donor units 104. Donor unit may also be referred to herein as a donor circuit, a donor card, or a donor interface.

Each RU 106 includes, or is otherwise associated with, a respective set of coverage antennas 108 via which downlink analog RF signals can be radiated to user equipment (UEs) 110 and via which uplink analog RF signals transmitted by UEs 110 can be received. The DAS 100 is configured to serve each base station 102 using a respective subset of RUs 106 (which may include less than all of the RUs 106 of the DAS 100). Also, the subsets of RUs 106 used to serve the base stations 102 may differ from base station 102 to base station 102. The subset of RUs points 106 used to serve a given base station 102 is also referred to here as the "simulcast zone" for that base station 102. In general, the wireless coverage of a base station 102 served by the DAS 100 is improved by radiating a set of downlink RF signals for that base station 102 from the coverage antennas 108 associated with the multiple RUs 106 in that base station's stations simulcast zone and by producing a single "combined" set of uplink base station signals or data that is provided to that base station 102. The single combined set of uplink base station signals or data is produced by a combining or summing process that uses inputs derived from the uplink RF signals received via the coverage antennas 108 associated with the RUs 106 in that base station's simulcast zone.

The DAS 100 can also include one or more intermediary combining nodes (ICNs) 112 (also referred to as "expansion" units or nodes). For each base station 102 served by a given ICN 112, the ICN 112 is configured to receive a set of uplink transport data for that base station 102 from a group of "southbound" entities (that is, from RUs 106 and/or other ICNs 112) and generate a single set of combined uplink transport data for that base station 102, which the ICN 112 transmits "northbound" towards the donor unit 104 serving that base station 102. The single set of combined uplink transport data for each served base station 102 is produced by a combining or summing process that uses inputs derived from the uplink RF signals received via the coverage antennas 108 of any southbound RUs 106 included in that base station's simulcast zone. As used here, "southbound" refers to traveling in a direction "away," or being relatively "farther," from the donor units 104 and base stations 102, and "northbound" refers to traveling in a direction "towards", or being relatively "closer" to, the donor units 104 and base stations 102.

In some configurations, each ICN 112 also forwards downlink transport data to the group of southbound RUs 106 and/or ICNs 112 served by that ICN 112. Generally, ICNs 112 can be used to increase the number of RUs 106 that can be served by the donor units 104 while reducing the processing and bandwidth load relative to having the additional RUs 106 communicate directly with each such donor unit 104.

Also, one or more RUs 106 can be configured in a "daisy-chain" or "ring" configuration in which transport data for at least some of those RUs 106 is communicated via at least one other RU 106. Each RU 106 would also perform the combining or summing process for any base station 102 that is served by that RU 106 and one or more of the southbound entities subtended from that RU 106. (Such a RU 106 also forwards northbound all other uplink transport data received from its southbound entities.)

The DAS 100 can include various types of donor units 104. One example of a donor unit 104 is an RF donor unit 114 that is configured to couple the DAS 100 to a base station 116 using the external analog radio frequency (RF) interface of the base station 116 that would otherwise be used to couple the base station 116 to one or more antennas (if the DAS 100 were not being used). This type of base station 116 is also referred to here as an "RF-interface" base station 116. An RF-interface base station 116 can be coupled to a corresponding RF donor unit 114 by coupling each antenna port of the base station 116 to a corresponding port of the RF donor unit 114.

Each RF donor unit 114 serves as an interface between each served RF-interface base station 116 and the rest of the DAS 100 and receives downlink base station signals from, and outputs uplink base station signals to, each served RF-interface base station 116. Each RF donor unit 114 performs at least some of the conversion processing necessary to convert the base station signals to and from the digital fronthaul interface format natively used in the DAS 100 for communicating time-domain baseband data. The downlink and uplink base station signals communicated between the RF-interface base station 116 and the donor unit 114 are analog RF signals. Also, in this example, the digital fronthaul interface format natively used in the DAS 100 for communicating time-domain baseband data can comprise the O-RAN fronthaul interface, a CPRI or enhanced CPRI (eCPRI) digital fronthaul interface format, or a proprietary digital fronthaul interface format (though other digital fronthaul interface formats can also be used).

Another example of a donor unit 104 is a digital donor unit that is configured to communicatively couple the DAS 100 to a baseband entity using a digital baseband fronthaul interface that would otherwise be used to couple the baseband entity to a radio unit (if the DAS 100 were not being used). In the example shown in FIG. 1A, two types of digital door units are shown.

The first type of digital donor unit comprises a digital donor unit 118 that is configured to communicatively couple the DAS 100 to a baseband unit (BBU) 120 using a time-domain baseband fronthaul interface implemented in accordance with a Common Public Radio Interface ("CPRI") specification. This type of digital donor unit 118 is also referred to here as a "CPRI" donor unit 118, and this type of BBU 120 is also referred to here as a CPRI BBU 120. For each CPRI BBU 120 served by a CPRI donor unit 118, the CPRI donor unit 118 is coupled to the CPRI BBU 120 using the CPRI digital baseband fronthaul interface that would otherwise be used to couple the CPRI BBU 120 to a CPRI remote radio head (RRH) (if the DAS 100 were not being used). A CPRI BBU 120 can be coupled to a corresponding CPRI donor unit 118 via a direct CPRI connection.

Each CPRI donor unit 118 serves as an interface between each served CPRI BBU 120 and the rest of the DAS 100 and receives downlink base station signals from, and outputs uplink base station signals to, each CPRI BBU 120. Each CPRI donor unit 118 performs at least some of the conversion processing necessary to convert the CPRI base station data to and from the digital fronthaul interface format natively used in the DAS 100 for communicating time-domain baseband data. The downlink and uplink base station signals communicated between each CPRI BBU 120 and the CPRI donor unit 118 comprise downlink and uplink fronthaul data generated and formatted in accordance with the CPRI baseband fronthaul interface.

The second type of digital donor unit comprises a digital donor unit 122 that is configured to communicatively couple the DAS 100 to a BBU 124 using a frequency-domain baseband fronthaul interface implemented in accordance with a O-RAN Alliance specification. The acronym "O-RAN" is an abbreviation for "Open Radio Access Network." This type of digital donor unit 122 is also referred to here as an "O-RAN" donor unit 122, and this type of BBU 124 is typically an O-RAN distributed unit (DU) and is also referred to here as an O-RAN DU 124. For each O-RAN DU 124 served by a O-RAN donor unit 122, the O-RAN donor unit 122 is coupled to the O-DU 124 using the O-RAN digital baseband fronthaul interface that would otherwise be used to couple the O-RAN DU 124 to a O-RAN RU (if the DAS 100 were not being used). An O-RAN DU 124 can be coupled to a corresponding O-RAN donor unit 122 via a switched Ethernet network. Alternatively, an O-RAN DU 124 can be coupled to a corresponding O-RAN donor unit 122 via a direct Ethernet or CPRI connection.

Each O-RAN donor unit 122 serves as an interface between each served O-RAN DU 124 and the rest of the DAS 100 and receives downlink base station signals from, and outputs uplink base station signals to, each O-RAN DU 124. Each O-RAN donor unit 122 performs at least some of any conversion processing necessary to convert the base station signals to and from the digital fronthaul interface format natively used in the DAS 100 for communicating frequency-domain baseband data. The downlink and uplink base station signals communicated between each O-RAN DU 124 and the O-RAN donor unit 122 comprise downlink and uplink fronthaul data generated and formatted in accordance with the O-RAN baseband fronthaul interface, where the user-plane data comprises frequency-domain baseband IQ data. Also, in this example, the digital fronthaul interface format natively used in the DAS 100 for communicating O-RAN fronthaul data is the same O-RAN fronthaul interface used for communicating base station signals between each O-RAN DU 124 and the O-RAN donor unit 122, and the "conversion" performed by each O-RAN donor unit 122 (and/or one or more other entities of the DAS 100) includes performing any needed "multicasting" of the downlink data received from each O-RAN DU 124 to the multiple RUs 106 in a simulcast zone for that O-RAN DU 124 (for example, by communicating the downlink fronthaul data to an appropriate multicast address and/or by copying the downlink fronthaul data for communication over different fronthaul links) and performing any need combining or summing of the uplink data received from the RUs 106 to produce combined uplink data provided to the O-RAN DU 124. It is to be understood that other digital fronthaul interface formats can also be used.

In general, the various base stations 102 are configured to communicate with a core network (not shown) of the associated wireless operator using an appropriate backhaul network (typically, a public wide area network such as the Internet). Also, the various base stations 102 may be from multiple, different wireless operators and/or the various base stations 102 may support multiple, different wireless protocols and/or RF bands.

In general, for each base station 102, the DAS 100 is configured to receive a set of one or more downlink base station signals from the base station 102 (via an appropriate donor unit 104), generate downlink transport data derived from the set of downlink base station signals, and transmit the downlink transport data to the RUs 106 in the base station's simulcast zone. For each base station 102 served by a given RU 106, the RU 106 is configured to receive the downlink transport data transmitted to it via the DAS 100 and use the received downlink transport data to generate one or more downlink analog radio frequency signals that are radiated from one or more coverage antennas 108 associated with that RU 106 for reception by user equipment 110. In this way, the DAS 100 increases the coverage area for the downlink capacity provided by the base stations 102. Also, for any southbound entities (for example, southbound RUs 106 or ICNs 112) coupled to the RU 106 (for example, in a daisy chain or ring architecture), the RU 106 forwards any downlink transport data intended for those southbound entities towards them.

For each base station 102 served by a given RU 106, the RU 106 is configured to receive one or more uplink radio frequency signals transmitted from the user equipment 110. These signals are analog radio frequency signals and are received via the coverage antennas 108 associated with that RU 106. The RU 106 is configured to generate uplink transport data derived from the one or more remote uplink radio frequency signals received for the served base station 102 and transmit the uplink transport data northbound towards the donor unit 104 coupled to that base station 102.

For each base station 102 served by the DAS 100, a single "combined" set of uplink base station signals or data is produced by a combining or summing process that uses inputs derived from the uplink RF signals received via the RUs 106 in that base station's simulcast zone. The resulting final single combined set of uplink base station signals or data is provided to the base station 102. This combining or summing process can be performed in a centralized manner in which the combining or summing process is performed by a single unit of the DAS 100 (for example, a donor unit 104 or master unit 130). This combining or summing process can also be performed in a distributed or hierarchical manner in which the combining or summing process is performed by multiple units of the DAS 100 (for example, a donor unit 104 (or master unit 130) and one or more ICNs 112 and/or RUs 106). Each unit of the DAS 100 that performs the combining or summing process for a given base station 102 receives uplink transport data from that unit's southbound entities and uses that data to generate combined uplink transport data, which the unit transmits northbound towards the base station 102. The generation of the combined uplink transport data involves, among other things, extracting in-phase and quadrature (IQ) data from the received uplink transport data and performing a combining or summing process using any uplink IQ data for that base station 102 in order to produce combined uplink IQ data.

Some of the details regarding how base station signals or data are communicated and transport data is produced vary based on which type of base station 102 is being served. In the case of an RF-interface base station 116, the associated RF donor unit 114 receives analog downlink RF signals from the RF-interface base station 116 and, either alone or in combination with one or more other units of the DAS 100, converts the received analog downlink RF signals to the digital fronthaul interface format natively used in the DAS 100 for communicating time-domain baseband data (for example, by digitizing, digitally down-converting, and filtering the received analog downlink RF signals in order to produce digital baseband IQ data and formatting the resulting digital baseband IQ data into packets) and communicates the resulting packets of downlink transport data to the various RUs 106 in the simulcast zone of that base station 116. The RUs 106 in the simulcast zone for that base station 116 receive the downlink transport data and use it to generate and radiate downlink RF signals as described above. In the uplink, either alone or in combination with one or more other units of the DAS 100, the RF donor unit 114 generates a set of uplink base station signals from uplink transport data received by the RF donor unit 114 (and/or the other units of the DAS 100 involved in this process). The set of uplink base station signals is provided to the served base station 116. The uplink transport data is derived from the uplink RF signals received at the RUs 106 in the simulcast zone of the served base station 116 and communicated in packets.

In the case of a CPRI BBU 120, the associated CPRI digital donor unit 118 receives CPRI downlink fronthaul data from the CPRI BBU 120 and, either alone or in combination with another unit of the DAS 100, converts the received CPRI downlink fronthaul data to the digital fronthaul interface format natively used in the DAS 100 for communicating time-domain baseband data (for example, by re-sampling, synchronizing, combining, separating, gain adjusting, etc. the CPRI baseband IQ data, and formatting the resulting baseband IQ data into packets), and communicates the resulting packets of downlink transport data to the various RUs 106 in the simulcast zone of that CPRI BBU 120. The RUs 106 in the simulcast zone of that CPRI BBU 120 receive the packets of downlink transport data and use them to generate and radiate downlink RF signals as described above. In the uplink, either alone or in combination with one or more other units of the DAS 100, the CPRI donor unit 118 generates uplink base station data from uplink transport data received by the CPRI donor unit 118 (and/or the other units of the DAS 100 involved in this process). The resulting uplink base station data is provided to that CPRI BBU 120. The uplink transport data is derived from the uplink RF signals received at the RUs 106 in the simulcast zone of the CPRI BBU 120.

In the case of an O-RAN DU 124, the associated O-RAN donor unit 122 receives packets of O-RAN downlink fronthaul data (that is, O-RAN user-plane and control-plane messages) from each O-RAN DU 124 coupled to that O-RAN digital donor unit 122 and, either alone or in combination with another unit of the DAS 100, converts (if necessary) the received packets of O-RAN downlink fronthaul data to the digital fronthaul interface format natively used in the DAS 100 for communicating O-RAN baseband data and communicates the resulting packets of downlink transport data to the various RUs 106 in a simulcast zone for that ORAN DU 124. The RUs 106 in the simulcast zone of each O-RAN DU 124 receive the packets of downlink transport data and use them to generate and radiate downlink RF signals as described above. In the uplink, either alone or in combination with one or more other units of the DAS 100, the O-RAN donor unit 122 generates packets of uplink base station data from uplink transport data received by the O-RAN donor unit 122 (and/or the other units of the DAS 100 involved in this process). The resulting packets of uplink base station data are provided to the O-RAN DU 124. The uplink transport data is derived from the uplink RF signals received at the RUs 106 in the simulcast zone of the served O-RAN DU 124 and communicated in packets.

In one implementation, one of the units of the DAS 100 is also used to implement a "master" timing entity for the DAS 100 (for example, such a master timing entity can be implemented as a part of a master unit 130 described below). In another example, a separate, dedicated timing master entity (not shown) is provided within the DAS 100. In either case, the master timing entity synchronizes itself to an external timing master entity (for example, a timing master associated with one or more of the O-DUs 124) and, in turn, that entity serves as a timing master entity for the other units of the DAS 100. A time synchronization protocol (for example, the Institute of Electrical and Electronics Engineers (IEEE) 1588 Precision Time Protocol (PTP), the Network Time Protocol (NTP), or the Synchronous Ethernet (SyncE) protocol) can be used to implement such time synchronization A management system (not shown) can be used to manage the various nodes of the DAS 100. In one implementation, the management system communicates with a predetermined "master" entity for the DAS 100 (for example, the master unit 130 described below), which in turns forwards or otherwise communicates with the other units of the DAS 100 for management-plane purposes. In another implementation, the management system communicates with the various units of the DAS 100 directly for management-plane purposes (that is, without using a master entity as a gateway).

Each base station 102 (including each RF-interface base station 116, CPRI BBU 120, and O-RAN DU 124), donor unit 104 (including each RF donor unit 114, CPRI donor unit 118, and O-RAN donor unit 122), RU 106, ICN 112, and any of the specific features described here as being implemented thereby, can be implemented in hardware, software, or combinations of hardware and software, and the various implementations (whether hardware, software, or combinations of hardware and software) can also be referred to generally as "circuitry," a "circuit," or "circuits" that is or are configured to implement at least some of the associated functionality. When implemented in software, such software can be implemented in software or firmware executing on one or more suitable programmable processors (or other programmable device) or configuring a programmable device (for example, processors or devices included in or used to implement special-purpose hardware, general-purpose hardware, and/or a virtual platform). In such a software example, the software can comprise program instructions that are stored (or otherwise embodied) on or in an appropriate non-transitory storage medium or media (such as flash or other non-volatile memory, magnetic disc drives, and/or optical disc drives) from which at least a portion of the program instructions are read by the programmable processor or device for execution thereby (and/or for otherwise configuring such processor or device) in order for the processor or device to perform one or more functions described here as being implemented the software. Such hardware or software (or portions thereof) can be implemented in other ways (for example, in an application specific integrated circuit (ASIC), etc.). Such entities can be implemented in other ways.

The DAS 100 can be implemented in a virtualized manner or a non-virtualized manner. When implemented in a virtualized manner, one or more nodes, units, or functions of the DAS 100 are implemented using one or more virtual network functions (VNFs) executing on one or more physical server computers (also referred to here as "physical servers" or just "servers") (for example, one or more commercial-off-the-shelf (COTS) servers of the type that are deployed in data centers or "clouds" maintained by enterprises, communication service providers, or cloud services providers). More specifically, in the exemplary embodiment shown in FIG. 1A, each O-RAN donor unit 122 is implemented as a VNF running on a server 126. The server 126 can execute other VNFs 128 that implement other functions for the DAS 100 (for example, fronthaul, management plane, and synchronization plane functions). The various VNFs executing on the server 126 are also referred to here as "master unit" functions 130 or, collectively, as the "master unit" 130. Also, in the exemplary embodiment shown in FIG. 1A, each ICN 112 is implemented as a VNF running on a server 132.

The RF donor units 114 and CPRI donor units 118 can be implemented as cards (for example, Peripheral Component Interconnect (PCI) Cards) that are inserted in the server 126. Alternatively, the RF donor units 114 and CPRI donor units 118 can be implemented as separate devices that are coupled to the server 126 via dedicated Ethernet links or via a switched Ethernet network (for example, the switched Ethernet network 134 described below).

In the exemplary embodiment shown in FIG. 1A, the donor units 104, RUs 106 and ICNs 112 are communicatively coupled to one another via a switched Ethernet network 134. Also, in the exemplary embodiment shown in FIG. 1A, an O-RAN DU 124 can be coupled to a corresponding O-RAN donor unit 122 via the same switched Ethernet network 134 used for communication within the DAS 100 (though each O-RAN DU 124 can be coupled to a corresponding O-RAN donor unit 122 in other ways). In the exemplary embodiment shown in FIG. 1A, the downlink and uplink transport data communicated between the units of the DAS 100 is formatted as O-RAN data that is communicated in Ethernet packets over the switched Ethernet network 134.

In the exemplary embodiment shown in FIG. 1A, the RF donor units 114 and CPRI donor units 118 are coupled to the RUs 106 and ICNs 112 via the master unit 130.

In the downlink, the RF donor units 114 and CPRI donor units 118 provide downlink time-domain baseband IQ data to the master unit 130. The master unit 130 generates downlink O-RAN user-plane messages containing downlink baseband IQ that is either the time-domain baseband IQ data provided from the donor units 114 and 118 or is derived therefrom (for example, where the master unit 130 converts the received time-domain baseband IQ data into frequency-domain baseband IQ data). The master unit 130 also generates corresponding downlink O-RAN control-plane messages for those O-RAN user-plane messages. The resulting downlink O-RAN user-plane and control-plane messages are communicated (multicasted) to the RUs 106 in the simulcast zone of the corresponding base station 102 via the switched Ethernet network 134.

In the uplink, for each RF-interface base station 116 and CPRI BBU 120, the master unit 130 receives O-RAN uplink user-plane messages for the base station 116 or CPRI BBU 120 and performs a combining or summing process using the uplink baseband IQ data contained in those messages in order to produce combined uplink baseband IQ data, which is provided to the appropriate RF donor unit 114 or CPRI donor unit 118. The RF donor unit 114 or CPRI donor unit 118 uses the combined uplink baseband IQ data to generate a set of base station signals or CPRI data that is communicated to the corresponding RF-interface base station 116 or CPRI BBU 120. If time-domain baseband IQ data has been converted into frequency-domain baseband IQ data for transport over the DAS 100, the donor unit 114 or 118 also converts the combined uplink frequency-domain IQ data into combined uplink time-domain IQ data as part of generating the set of base station signals or CPRI data that is communicated to the corresponding RF-interface base station 116 or CPRI BBU 120.

In the exemplary embodiment shown in FIG. 1A, the master unit 130 (more specifically, the O-RAN donor unit 122) receives downlink O-RAN user-plane and control-plane messages from each served O-RAN DU 124 and communicates (multicasts) them to the RUs 106 in the simulcast zone of the corresponding O-RAN DU 124 via the switched Ethernet network 134. In the uplink, the master unit 130 (more specifically, the O-RAN donor unit 122) receives O-RAN uplink user-plane messages for each served O-RAN DU 124 and performs a combining or summing process using the uplink baseband IQ data contained in those messages in order to produce combined uplink IQ data. The O-RAN donor unit 122 produces O-RAN uplink user-plane messages containing the combined uplink baseband IQ data and communicates those messages to the O-RAN DU 124.

In the exemplary embodiment shown in FIG. 1A, only uplink transport data is communicated using the ICNs 112, and downlink transport data is communicated from the master unit 130 to the RUs 106 without being forwarded by, or otherwise communicated using, the ICNs 112.

Figure 1B:
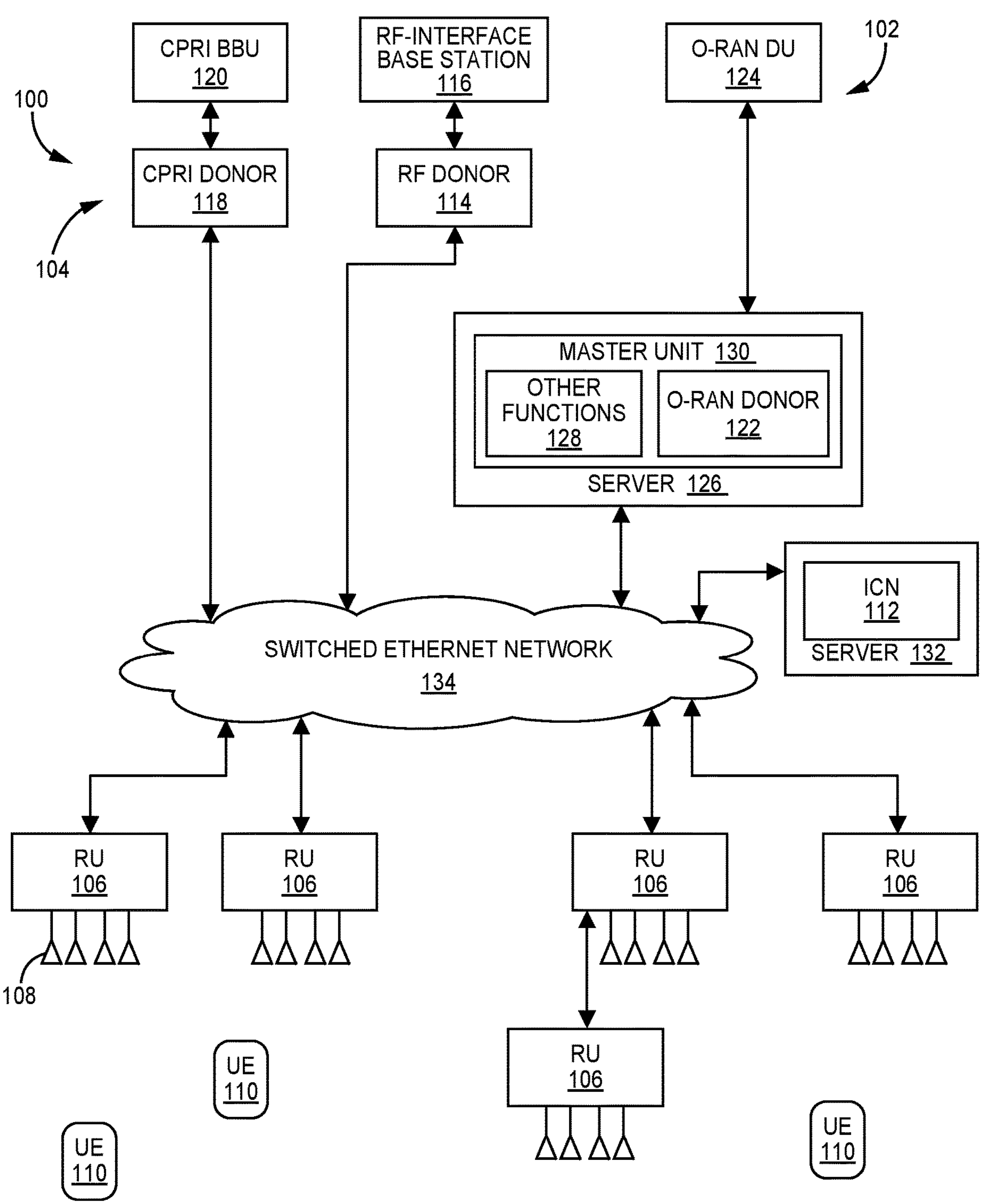
FIG. 1B illustrates another exemplary embodiment of a DAS.
Figure 1C:
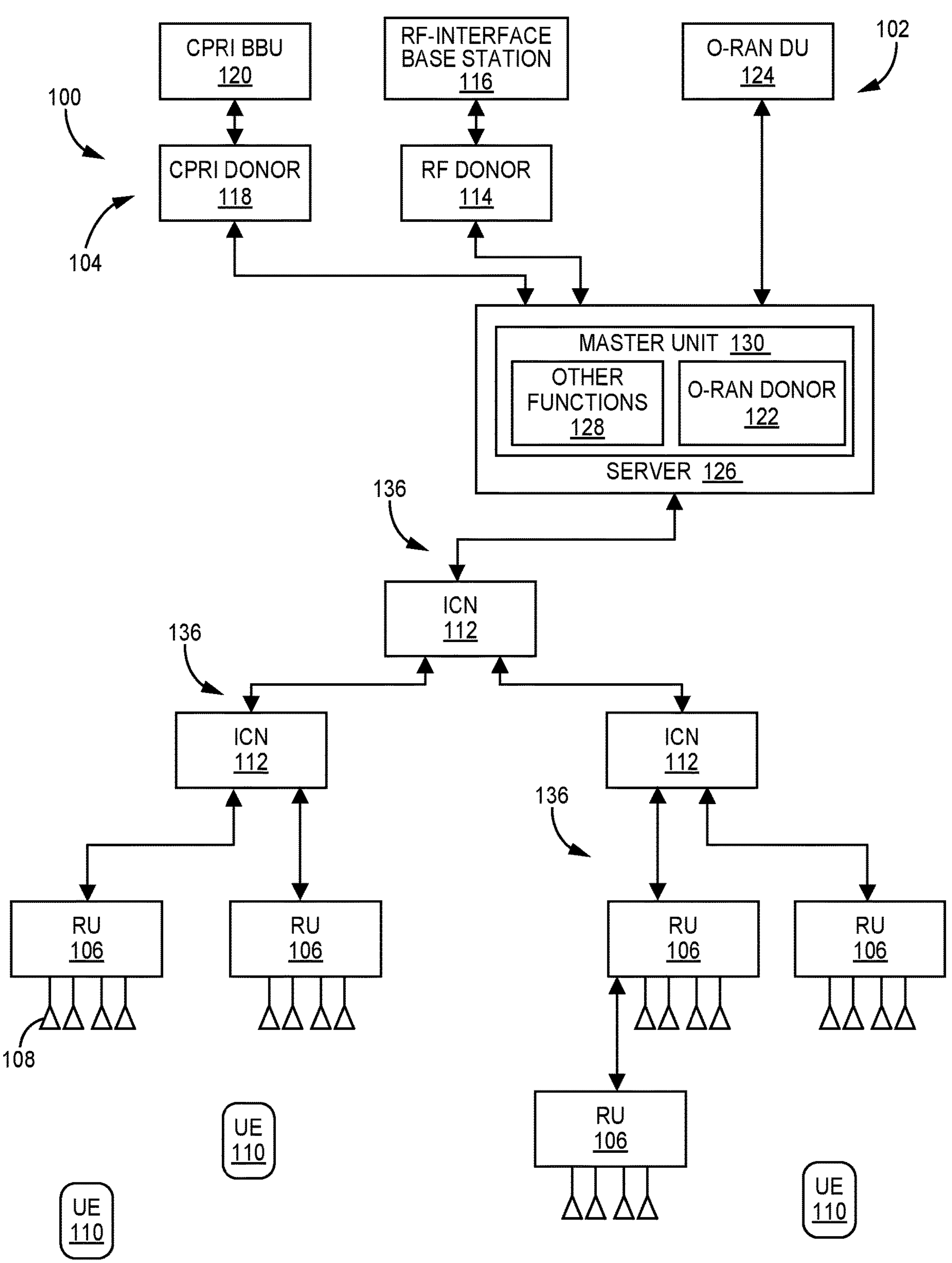
FIG. 1C illustrates another exemplary embodiment of a DAS.

FIG. 1B illustrates another exemplary embodiment of a DAS 100. The DAS 100 shown in FIG. 1B is the same as the DAS 100 shown in FIG. 1A except as described below. In the exemplary embodiment shown in FIG. 1B, the RF donor units 114 and CPRI donor units 118 are coupled directly to the switched Ethernet network 134 and not via the master unit 130, as is the case in the embodiment shown in FIG. 1A.

As described above, in the exemplary embodiment shown in FIG. 1A, the master unit 130 performs some transport functions related to serving the RF-interface base stations 116 and CPRI BBUs 120 coupled to the donor units 114 and 118. In the exemplary embodiment shown in FIG. 1B, the RF donor units 114 and CPRI donor units 118 perform those transport functions (that is, the RF donor units 114 and CPRI donor units 118 perform all of the transport functions related to serving the RF-interface base stations 116 and CPRI BBUs 120, respectively).

The exemplary embodiments of FIGS. 1A and 1B illustrate a switched Ethernet network 134 to communicatively couple RUs 106 and other components (e.g., ICN 112, RF donor 114, CPRI donor 118, O-RAN donor 122, and master unit 130) of the DAS 100. The switched Ethernet network 134 may comprise at least one access switch and/or at least one aggregation switch. To reduce latency in uplink and downlink paths of the DAS 100, one or more, e.g., all, switches of the switched Ethernet network 134 may be configured to perform cut-through forwarding. Using the cut-through forwarding mode, rather store and forward, in a switch eliminates latency in the switch because data of a frame (or a packet) is forwarded by the switch before the whole frame (or packet) has been received, e.g., as soon as a destination address and an outgoing interface of the switch are determined. Store and forward mode of a switch requires that the frame (or the packet) be completely received by the switch before any data of the frame (or the packet) is forwarded by the switch. Cut-through forwarding may be implemented in embodiments of a DAS 100 including a switched Ethernet network 134, and not just those embodiments described herein, e.g., illustrated in FIGS. 1A and 1B. One embodiment of cut-through forwarding is described herein with respect to FIG. 4A.

Figure 4A:
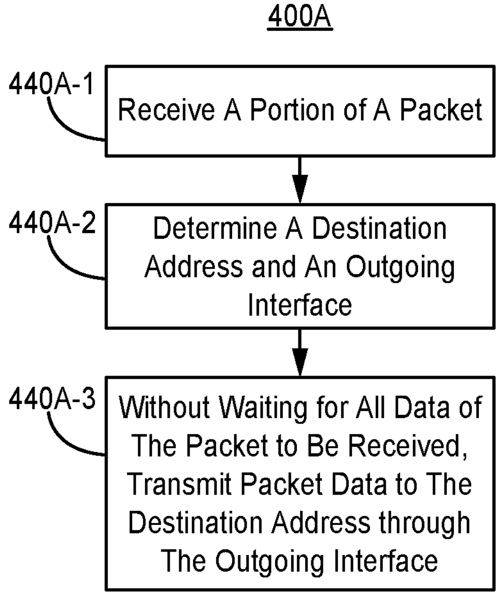
FIG. 4A illustrates a flow diagram of one embodiment of a method of diminishing latency in a DAS including a switched Ethernet network coupling a donor interface to a plurality of radio units.

FIG. 4A illustrates a flow diagram of one embodiment of a method 400A of diminishing latency in a DAS including a switched Ethernet network coupling a donor interface to a plurality of radio units. Optionally, method 400A may be implemented in all or some of the DASs described with respect to one or more of FIGS. 1A and 1B, and/or in other DAS implementations.

The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440A-1, a portion of data of a packet is received at a switch of a switched Ethernet network. For example, the portion of the packet that is received can include the header of the packet. In the embodiments described here, some of the packets are used to communicate time-domain digital data. In block 440A-2, a destination address for the packet and an outgoing interface of the switch are determined using the portion of the data of the packet. In block 440A-3, after determining the destination address and the outgoing interface and without waiting for all data of the packet to be received by the switch, data of the packet is transmitted from the switch to the destination address through the outgoing interface of the switch.

The DAS 100 shown in FIG. 10 is the same as the DAS 100 shown in FIG. 1A except as described below. In the exemplary embodiment shown in FIG. 10, the donor units 104, RUs 106 and ICNs 112 are communicatively coupled to one another via point-to-point Ethernet links 136 (instead of a switched Ethernet network). Also, in the exemplary embodiment shown in FIG. 10, an O-RAN DU 124 can be coupled to a corresponding O-RAN donor unit 122 via a switched Ethernet network (not shown in FIG. 10), though that switched Ethernet network is not used for communication within the DAS 100. In the exemplary embodiment shown in FIG. 10, the downlink and uplink transport data communicated between the units of the DAS 100 is communicated in Ethernet packets over the point-to-point Ethernet links 136. As a result, use of Ethernet switches with store and forward functionality is avoided, diminishing latency in the Ethernet fronthaul network.

For each southbound point-to-point Ethernet link 136 that couples a master unit 130 to an ICN 112, the master unit 130 assembles downlink transport frames and communicates them in downlink Ethernet packets to the ICN 112 over the point-to-point Ethernet link 136. For each point-to-point Ethernet link 136, each downlink transport frame multiplexes together downlink time-domain baseband IQ data and Ethernet data that needs to be communicated to southbound RUs 106 and ICNs 112 that are coupled to the master unit 130 via that point-to-point Ethernet link 136. The downlink time-domain baseband IQ data is sourced from one or more RF donor units 114 and/or CPRI donor units 118. The Ethernet data comprises downlink user-plane and control-plane O-RAN fronthaul data sourced from one or more O-RAN donor units 122 and/or management-plane data sourced from one or more management entities for the DAS 100. That is, this Ethernet data is encapsulated into downlink transport frames that are also used to communicate downlink time-domain baseband IQ data and this Ethernet data is also referred to here as "encapsulated" Ethernet data. The resulting downlink transport frames are communicated in the payload of downlink Ethernet packets communicated from the master unit 130 to the ICN 112 over the point-to-point Ethernet link 136. The Ethernet packets into which the encapsulated Ethernet data is encapsulated are also referred to here as "transport" Ethernet packets.

Each ICN 112 receives downlink transport Ethernet packets via each northbound point-to-point Ethernet link 136 and extracts any downlink time-domain baseband IQ data and/or encapsulated Ethernet data included in the downlink transport frames communicated via the received downlink transport Ethernet packets. Any encapsulated Ethernet data that is intended for the ICN 112 (for example, management-plane Ethernet data) is processed by the ICN 112.

For each southbound point-to-point Ethernet link 136 coupled to the ICN 112, the ICN 112 assembles downlink transport frames and communicates them in downlink Ethernet packets to the southbound entities subtended from the ICN 112 via the point-to-point Ethernet link 136. For each southbound point-to-point Ethernet link 136, each downlink transport frame multiplexes together downlink time-domain baseband IQ data and Ethernet data received at the ICN 112 that needs to be communicated to those subtended southbound entities. The resulting downlink transport frames are communicated in the payload of downlink transport Ethernet packets communicated from the ICN 112 to those subtended southbound entities ICN 112 over the point-to-point Ethernet link 136.

Each RU 106 receives downlink transport Ethernet packets via each northbound point-to-point Ethernet link 136 and extracts any downlink time-domain baseband IQ data and/or encapsulated Ethernet data included in the downlink transport frames communicated via the received downlink transport Ethernet packets. As described above, the RU 106 uses any downlink time-domain baseband IQ data and/or downlink O-RAN user-plane and control-plane fronthaul messages to generate downlink RF signals for radiation from the set of coverage antennas 108 associated with that RU 106. The RU 106 processes any management-plane messages communicated to that RU 106 via encapsulated Ethernet data.

Also, for any southbound point-to-point Ethernet link 136 coupled to the RU 106, the RU 106 assembles downlink transport frames and communicates them in downlink Ethernet packets to the southbound entities subtended from the RU 106 via the point-to-point Ethernet link 136. For each southbound point-to-point Ethernet link 136, each downlink transport frame multiplexes together downlink time-domain baseband IQ data and Ethernet data received at the RU 106 that needs to be communicated to those subtended southbound entities. The resulting downlink transport frames are communicated in the payload of downlink transport Ethernet packets communicated from the RU 106 to those subtended southbound entities ICN 112 over the point-to-point Ethernet link 136.

In the uplink, each RU 106 generates uplink time-domain baseband IQ data and/or uplink O-RAN user-plane fronthaul messages for each RF-interface base station 116, CPRI BBU 120, and/or O-RAN DU 124 served by that RU 106 as described above. For each northbound point-to-point Ethernet link 136 of the RU 106, the RU 106 assembles uplink transport frames and communicates them in uplink transport Ethernet packets northbound towards the appropriate master unit 130 via that point-to-point Ethernet link 136. For each northbound point-to-point Ethernet link 136, each uplink transport frame multiplexes together uplink time-domain baseband IQ data originating from that RU 106 and/or any southbound entity subtended from that RU 106 as well as any Ethernet data originating from that RU 106 and/or any southbound entity subtended from that RU 106. In connection with doing this, the RU 106 performs the combining or summing process described above for any base station 102 served by that RU 106 and also by one or more of the subtended entities. (The RU 106 forwards northbound all other uplink data received from those southbound entities.) The resulting uplink transport frames are communicated in the payload of uplink transport Ethernet packets northbound towards the master unit 130 via the associated point-to-point Ethernet link 136.

Each ICN 112 receives uplink transport Ethernet packets via each southbound point-to-point Ethernet link 136 and extracts any uplink time-domain baseband IQ data and/or encapsulated Ethernet data included in the uplink transport frames communicated via the received uplink transport Ethernet packets. For each northbound point-to-point Ethernet link 136 coupled to the ICN 112, the ICN 112 assembles uplink transport frames and communicates them in uplink transport Ethernet packets northbound towards the master unit 130 via that point-to-point Ethernet link 136. For each northbound point-to-point Ethernet link 136, each uplink transport frame multiplexes together uplink time-domain baseband IQ data and Ethernet data received at the ICN 112 that needs to be communicated northbound towards the master unit 130. In connection with doing this, the ICN 112 performs the combining or summing process described above for any base station 102 served by that ICN 112 for which it has received uplink baseband IQ data from multiple entities subtended from that ICN 112. The resulting uplink transport frames are communicated in the payload of uplink transport Ethernet packets communicated northbound towards the master unit 130 over the point-to-point Ethernet link 136.

Each master unit 130 receives uplink transport Ethernet packets via each southbound point-to-point Ethernet link 136 and extracts any uplink time-domain baseband IQ data and/or encapsulated Ethernet data included in the uplink transport frames communicated via the received uplink transport Ethernet packets. Any extracted uplink time-domain baseband IQ data, as well as any uplink O-RAN messages communicated in encapsulated Ethernet, is used in producing a single "combined" set of uplink base station signals or data for the associated base station 102 as described above (which includes performing the combining or summing process). Any other encapsulated Ethernet data (for example, management-plane Ethernet data) is forwarded on towards the respective destination (for example, a management entity).

In the exemplary embodiment shown in FIG. 10, synchronization-plane messages are communicated using native Ethernet packets (that is, non-encapsulated Ethernet packets) that are interleaved between the transport Ethernet packets.

Figure 1D:
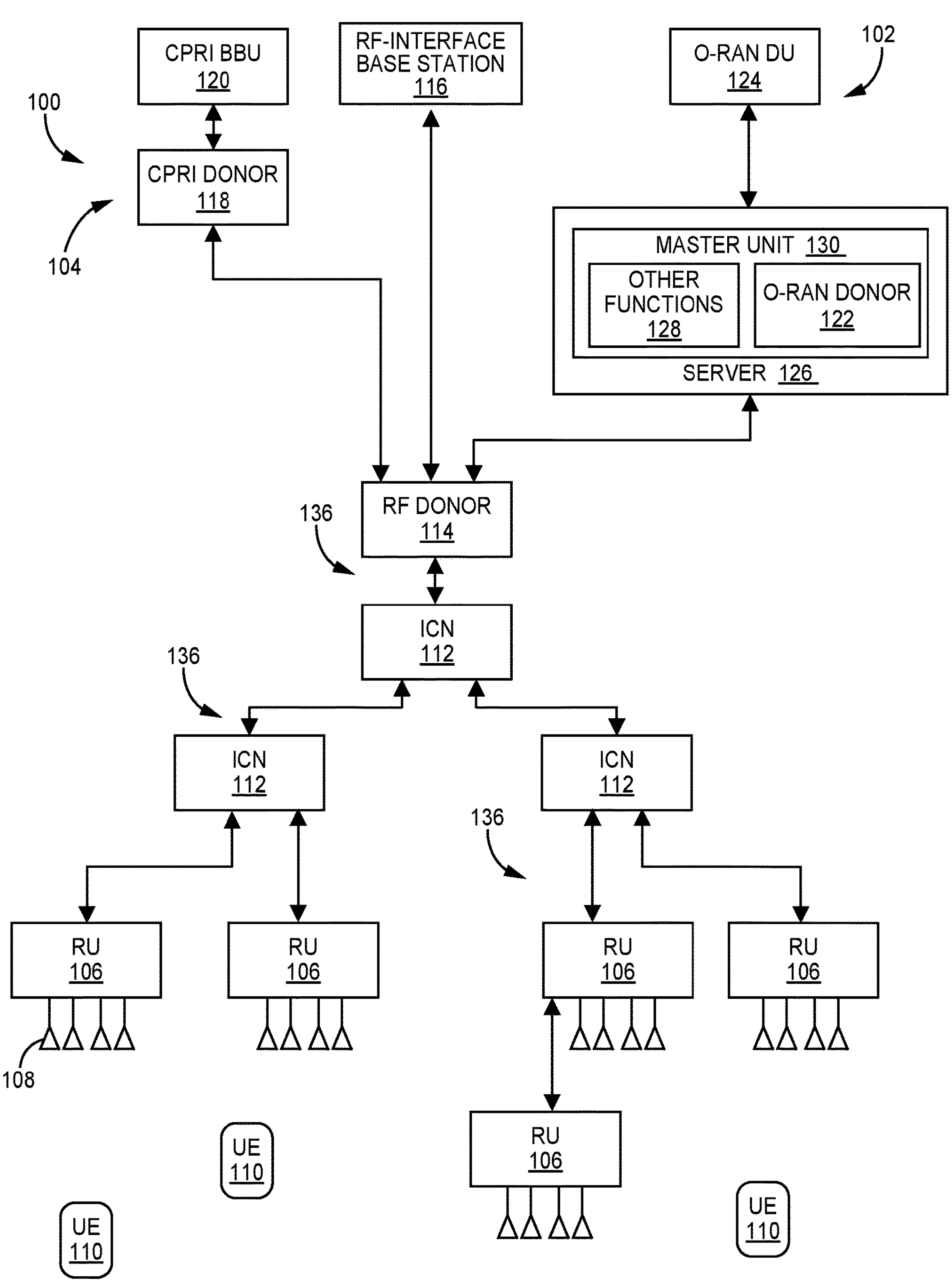
FIG. 1D illustrates another exemplary embodiment of a DAS.

FIG. 1D illustrates another exemplary embodiment of a DAS 100. The DAS 100 shown in FIG. 1D is the same as the DAS 100 shown in FIG. 10 except as described below. In the exemplary embodiment shown in FIG. 1D, the CPRI donor units 118, O-RAN donor unit 122, and master unit 130 are coupled to the RUs 106 and ICNs 112 via one or more RF donors 114. That is, each RF donor 114 performs the transport frame multiplexing and demultiplexing that is described above in connection with FIG. 10 as being performed by the master unit 130.

Figure 2:
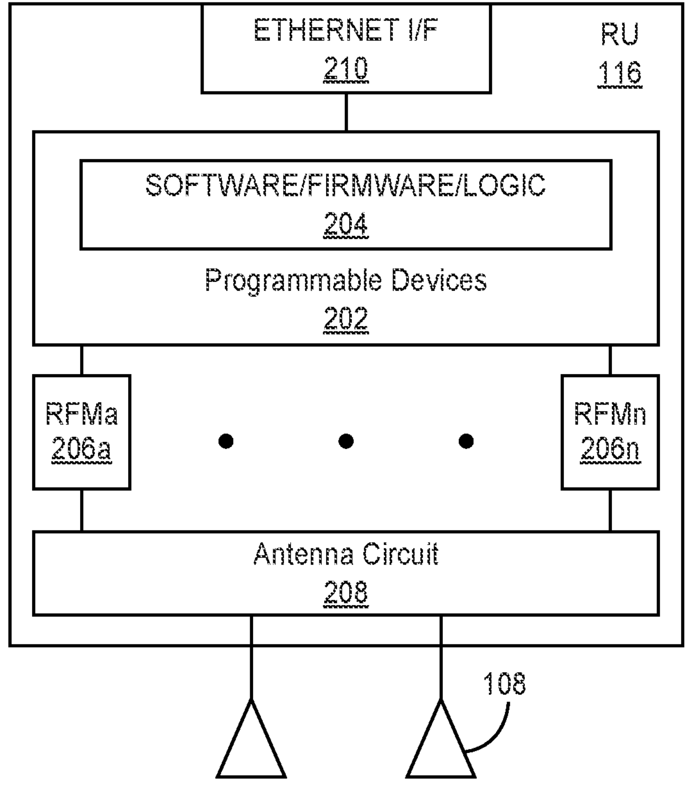
FIG. 2 is a block diagram illustrating one exemplary embodiment of an access point that can be used in the DASs of FIGS. 1A-1D.

FIG. 2 is a block diagram illustrating one exemplary embodiment of a radio unit (RU) 114 that can be used in the DASs 100 of FIGS. 1A-1D. The RU 116 comprises one or more programmable devices 202 that execute, or are otherwise programmed or configured by, software, firmware, or configuration logic 204 in order to implement at least some functions described here as being performed by the RU 116. The one or more programmable devices 202 can be implemented in various ways (for example, using programmable processors (such as microprocessors, co-processors, and processor cores integrated into other programmable devices) and/or programmable logic (such as FPGAs and system-on-chip packages)). Where multiple programmable devices are used, all of the programmable devices do not need to be implemented in the same way. In general, the programmable devices 202 and software, firmware, or configuration logic 204 are scaled so as to be able implement multiple logical (or virtual) RU entities using the (physical) RU 106. The various functions described here as being performed by an RU entity are implemented by the programmable devices 202 and one or more of radio frequency (RF) modules (RFM) 206 *a-n* of the RU 116. Each RF module 206 *a-n* is configured to be coupled to one or more antennas 108 through an antenna circuit 208.

Each RF module 206 *a-n* comprises circuitry that implements the RF transceiver functions for a given RU 116 and provides an interface to the coverage antennas 108 associated with that AP 114. Each RF module 206 *a-n* can be implemented using one or more RF integrated circuits (RFICs) and/or discrete components.

Each RF module 206 *a-n* comprises circuitry that implements, for the associated RU 116, a respective downlink and uplink signal path for each of the antennas 108 associated with that RU 116. In one exemplary implementation, each downlink signal path receives the downlink baseband IQ data output by the one or more programmable devices 202 for the associated antenna 108, converts the downlink baseband IQ data to an analog signal (including the various physical channels and associated sub carriers), upconverts the analog signal to the appropriate RF band (if necessary), and filters and power amplifies the analog RF signal. (The up-conversion to the appropriate RF band can be done directly by the digital-to-analog conversion process outputting the analog signal in the appropriate RF band or via an analog upconverter included in that downlink signal path.) The resulting amplified downlink analog RF signal output by each downlink signal path is provided to the associated antenna 108 via an antenna circuit 208 (which implements any needed frequency-division duplexing (FDD) or time-division-duplexing (TDD) functions) including filtering and combining.

In one exemplary implementation, the uplink RF analog signal (including the various physical channels and associated sub carriers) received by each antenna 108 is provided, via the antenna circuit 208, to an associated uplink signal path in each RF module 206 *a-n*.

Each uplink signal path in each RF module 206 *a-n* receives the uplink RF analog received via the associated antenna 108, low-noise amplifies the uplink RF analog signal, and, if necessary, filters and, if necessary, down-converts the resulting signal to produce an intermediate frequency (IF) or zero IF version of the signal.

Each uplink signal path in each RF module 206 *a-n* converts the resulting analog signals to real or IQ digital samples and outputs them to the one or more programmable logical devices 202 for uplink signal processing. (The analog-to-digital conversion process can be implemented using a direct RF ADC that can receive and digitize RF signals, in which case no analog down-conversion is necessary.)

Also, in this exemplary embodiment, for each coverage antenna 108, the antenna circuit 208 is configured to combine (for example, using one or more band combiners) the amplified analog RF signals output by the appropriate downlink signal paths of the various RF modules 206 *a-n* for transmission using each coverage antenna 108 and to output the resulting combined signal to that coverage antenna 108. Likewise, in this exemplary embodiment, for each coverage antenna 108, the antenna circuit 208 is configured to split (for example, using one or more band filter and/or RF splitters) the uplink analog RF signals received using that coverage antenna 108 in order to supply, to the appropriate uplink signal paths of the RF modules 206 *a-n* used for that antenna 108, a respective uplink analog RF signals for that signal path.

Figure 3:
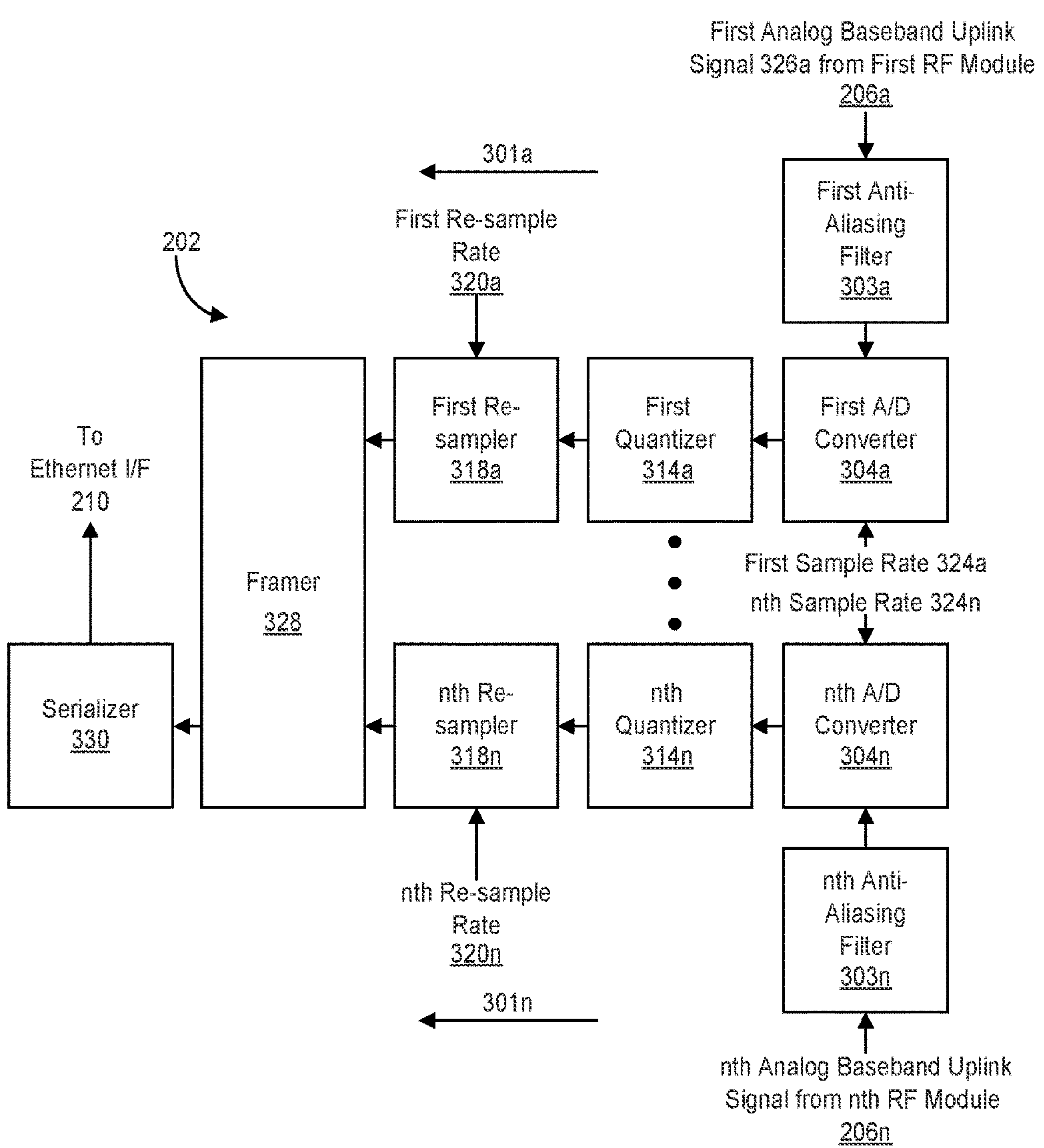
FIG. 3 illustrates a block diagram of one embodiment of the programmable devices of a radio unit.

It is to be understood that the preceding description is one example of how each downlink and uplink signal path of each RF module 206 *a-n* can be implemented; it is to be understood, however, that the downlink and uplink signal paths can be implemented in other ways. FIG. 3 illustrates a block diagram of one embodiment of the programmable devices 202 of a radio unit 116. The illustrated embodiment of the programmable devices 202 is configured to digitize, frame, and serialize n analog baseband uplink signal(s) 326 *a-n* received from the RF modules 206 *a-n*. The analog baseband uplink signal(s) 326 *a-n* comprises I and Q samples. The programmable devices 202 transmits the n digitized, framed, and serialized analog baseband uplink signal(s) to other component(s) of the DAS, e.g., a master unit, further along the uplink path in the DAS fronthaul.

The illustrated embodiment of the programmable devices 202 comprises n uplink paths 301 *a-n*. Each uplink path includes an anti-aliasing filter 303 *a-n*, an analog to digital converter (ADC) 304 *a-n*, a quantizer 314 *a-n*, a resampler 318 *a-n*, a framer, and a serializer 330. n as used herein for FIGS. 2 and 3 is an integer number greater than zero.

Operation of one uplink path will now be described. An analog baseband uplink signal 326 *a-n* is received at an anti-aliasing filter 303 *a-n* from a corresponding RF module 206 *a-n*. The analog baseband uplink signal(s) 326 *a-n* may be derived from various sources, e.g., carriers, through RF modules 206 *a-n*. The input signals 326 *a-n* may be associated with different bandwidths, such as the bandwidths of the input signals 326 *a-n* and/or the bandwidths owned by the carriers.

The anti-aliasing filter 303 *a-n* configured to filter the analog baseband uplink signal 326 *a-n*, e.g., to remove undesired signals outside of the bandwidth of the analog baseband uplink signal 326 *a-n*. An output of the anti-aliasing filter 303 is configured to provide the filtered, analog baseband uplink signal to a first input of an ADC 304 *a-n*. A second input of the ADC 304 *a-n* is configured to receive a sample rate 324 *a-n*. The ADC 304 *a-n* is configured to convert the filtered analog baseband uplink signal to a filtered, digitized baseband uplink signal. The filtered, digitized baseband uplink signal comprises I and Q samples. Each digitized I sample and Q sample is quantitized and comprises a certain number of bits, e.g., 12 bits.

To further reduce jiffy time and thus latency, a number of bits, of each I sample and sample (to be incorporated in the application layer payload of a packet), may be requantitized to reduce, e.g., minimize, the number of bits used to convey each I sample and Q sample. Thus, a quantizer 314 *a-n*, may be coupled to an output of each ADO 304 *a-n*, Such quantizers 314 *a-n* may each be Lloyd-Max quantizer; however, other types of quantizers may be used to diminish a number of bits used to quantize each I sample and each Q sample. Thus, for example using a Lloyd-Max quantizer, the number of bits of each sample and Q sample may be reduced from 12 bits to 11 bits.

An output of the quantizer 314 *a-n* is coupled to a first input of a resampler 418 *a-n* which is configured to receive a requantized, filtered, digitized baseband uplink signal from the output of the quantizer 314 *a-n*. A second input of the resampler 418 *a-n* is configured to receive a re-sample rate. Each resampler 418 *a-n* is configured to re-sample a corresponding requantized, filtered, digitized baseband uplink signal at a resample rate which is selected based on one or more factors, such as a bandwidth of the analog signal that the particular digitized signal being resampled represents. Thus, each of the resampling rates 320 *a-n* may be the same or different. Further, resampling the requantized, filtered, digitized baseband uplink signal, bandwidth of a serial link, coupling the RU 116 to another component of the DAS 100, can be more efficiently utilized without requiring a specially configured ADC.

Returning to the embodiment of the programmable devices 202 illustrated in FIG. 3, an output of each resampler 318 *a-n* is coupled to the framer 328. The framer 328 is configured to receive resampled, requantized, filtered, digitized baseband uplink signals from outputs of each resampler 318 *a-n*. The framer 328 is configured to create a frame of data by time multiplexing resampled, requantized, filtered, digitized baseband uplink signal. Optionally, the framer 328 may be implemented differently for a DAS fronthaul using switched Ethernet.

The illustrated embodiment of the programmable devices 202 include a serializer 330 having an input coupled to an output of the framer 328. The serializer 330 is configured to serialize the framed data to generate a serialized frame. The serialized frame is configured to be conveyed to the Ethernet interface 210, and then to another component of the DAS 100.

For pedagogical reasons, the use of quantizers 314 *a-n* has been illustrated in a radio unit for communications in an uplink path. Quantizers can be also incorporated in the downlink path of a DAS fronthaul, and for example would be located in the master unit or a donor interface. Optionally, operation of the quantizers would work in a downlink path as illustrated above for the uplink path.

Figure 4B:
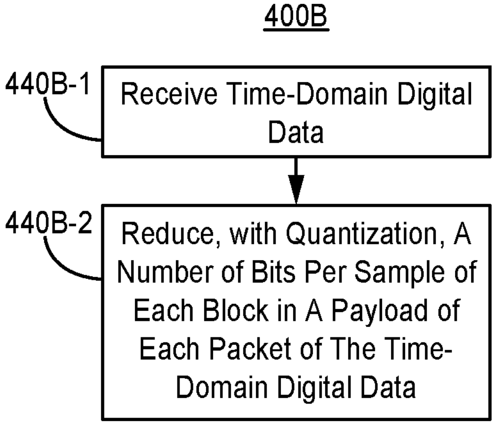
FIG. 4B illustrates a flow diagram of one embodiment of a method of diminishing latency in a DAS comprising a plurality of radio units communicatively coupled to one of (a) a donor card configured to communicatively couple the DAS to a base station and (b) a master unit communicatively coupled to the donor card.

FIG. 4B illustrates a flow diagram of one embodiment of a method 400B of diminishing latency in a DAS comprising a plurality of RUs communicatively coupled to one of (a) a donor card configured to communicatively couple the DAS to a base station and (b) a master unit communicatively coupled to the donor card. For purposes of clarity, method 400B may be implement in one or both the uplink path and the downlink path of the DAS. Optionally, method 400B may be implemented in all or some of the DASs described with respect to one or more of FIGS. 1A-1E, and/or in other DAS implementations.

The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440B-1, time-domain digital data is received. Optionally, downlink time-domain digital data is received at one of (a) the donor card and (b) the master unit and uplink time-domain data is received in an RU. Optionally, prior to receiving the time-domain digital data, converting an analog baseband signal to the time-domain digital signal.

In block 440B-2, a number of bits per sample of each block in a payload of each packet of the time-domain digital data is reduced with quantization. Optionally, reduction of the number of bits per sample of each block in a payload of each packet of the downlink time-domain digital data is reduced with quantization in the one of (a) the donor card and (b) the master unit. Optionally, reduction of the number of bits per sample of each block in a payload of each packet of the uplink time-domain digital data is reduced with quantization in the RU. Optionally, such quantization is Lloyd-Max quantization.

In one example, an ICN, and a master unit (MU) and/or an RF donor (RFD) were executed in software on one or more servers. As a result, the following process occurred. Uplink data was conveyed from RUs through one or more Ethernet access and/or aggregation switches to the ICN executed by a server. ICN data output from the ICN was then conveyed through at least one Ethernet switch to the MU and/or RFD executed on the same or a different server. This involved at least three hops through an Ethernet switch which when operating in a store and forward mode increased uplink latency in the DAS fronthaul network.

Figure 1E:
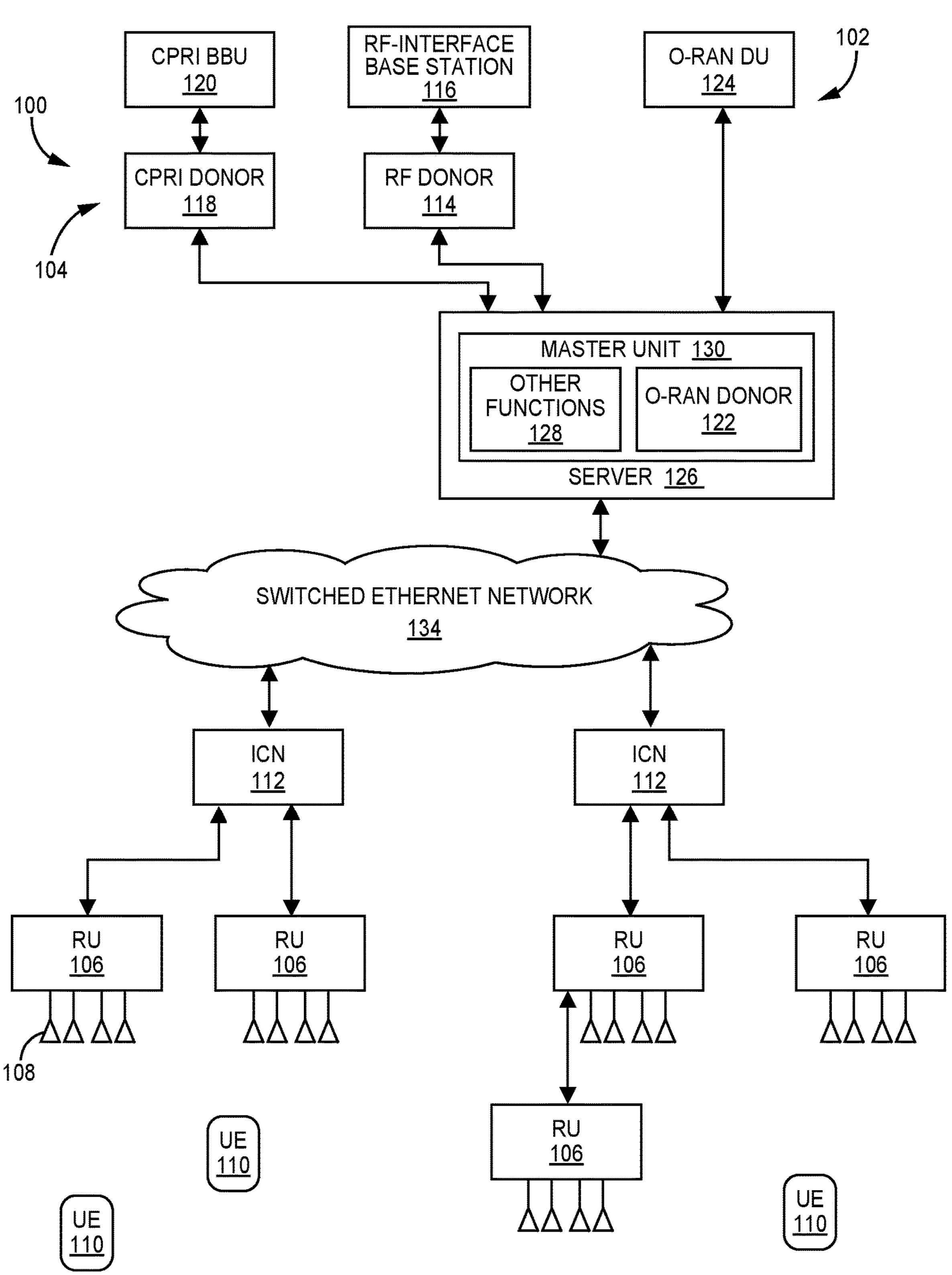
FIG. 1E illustrates another exemplary embodiment of a DAS.

FIG. 1E illustrates another exemplary embodiment of a DAS 100. The illustrated embodiment diminishes uplink latency in the DAS fronthaul network by eliminating one or more hops through Ethernet switch(es) using a store and forward function. The illustrated ICNs are implemented in hardware, rather than software executed on a server, to provide low latency in the ICN and have an, e.g., an Ethernet, input port and an, e.g., an Ethernet, output port. Optionally, an ICN implemented in hardware replaces an Ethernet access or aggregation switch, e.g., an Ethernet access switch communicatively coupling RU(s) to the ICN implemented in hardware; however, in alternative embodiments, such an Ethernet access switch may be used with the ICN implemented in hardware. Thus, optionally, no Ethernet access switches are used between each RU and an Ethernet aggregation switch which couples ICN(s) implemented in hardware with a MU and/or a RFD.

The use of the ICN implemented in hardware eliminates one or two hops through Ethernet switches using the store and forwarding function. Each such hardware implemented ICN streams data, e.g., using cut-through forwarding (described elsewhere herein), through such ICN. Thus, latency in an uplink of a DAS 100 is reduced. The aforementioned technique may be used in other DAS implementations which differ from the DAS implementation illustrated in FIG. 1E.

Figure 4C:
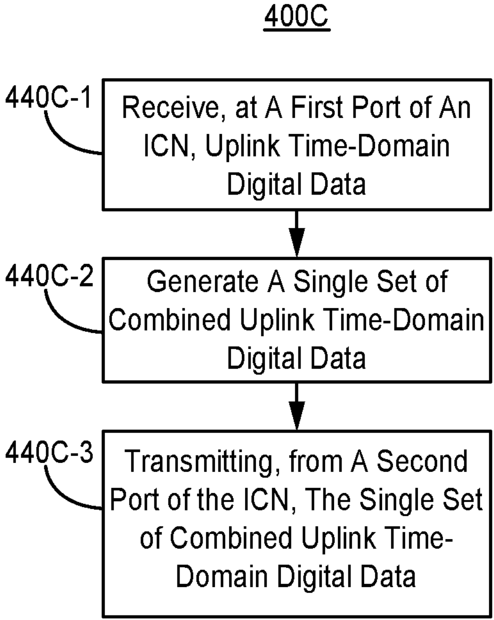
FIG. 4C illustrates a flow diagram of one embodiment of a method of diminishing latency in an uplink path of a DAS.

FIG. 4C illustrates a flow diagram of one embodiment of a method 400C of diminishing latency in an uplink path of a DAS. The DAS includes a plurality of radio units (RUs) communicatively coupled through an intermediate combining node (ICN) to a switched Ethernet network. The switched Ethernet network is communicatively coupled to a donor card. The donor card is configured to communicatively couple the DAS to a base station and to communicate time-domain digital data there between. Optionally, method 400C may be implemented in the DAS described with respect to FIG. 1E, and/or in other DAS implementations.

The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440C-1, a set of uplink time-domain digital data for the base station from each of the one or more of a plurality of RUs is received at a first port of an ICN. Optionally the set of uplink time-domain digital data is received through a first point to point Ethernet network. In block 440C-2, a single set of combined uplink time-domain digital data is generated in the ICN from the set of uplink time-domain digital data and for the base station. In block 440C-3, the single set of combined uplink time-domain digital data, for the base station, are transmitted from a second port of the ICN to a donor card through a switched Ethernet network. Optionally, the single set of combined uplink time domain data is transmitted through a second point to point Ethernet network.

Some embodiments of the invention provide enhanced fronthaul efficiency by providing a satisfactory data sample rate in a DAS, satisfactory packet efficiency in the DAS, a fixed and low packet latency of the DAS, and satisfactory data throughput through the DAS. Because packet latency is fixed, a size of a packet, e.g., size of an application layer payload of the packet, is a function of carrier bandwidth. Packet, as used herein except with respect to an Internet Protocol (IP) packet, means data or a payload of an Ethernet frame. An IP packet includes the Ethernet frame and additional header information, e.g., an IP address. Carrier, as used herein, means a communication channel used for wireless communication between a donor base station and user equipment (which can be specified by the center frequency of the RF spectrum used for such a channel).

In the optional embodiments described herein, the following are used: 12-bit time-domain in-phase and quadrature (IQ) data and sample rates that are integer multiples of a number greater than a data bandwidth and less than twice the carrier bandwidth, e.g., 6.144[1] Megasamples per second (Msps), 7.68 Msps, or another sample rate, to reduce signal processing filter coefficient size (and thus signal processing filter implementation cost) and increase packet efficiency. Optionally, embodiments of the invention support data bandwidths used in frequency range FR1 in a 5G New Radio standard. Packet efficiency means a ratio of I/O data communicated in a packet with respect to total packet size.[2] However, packet efficiency must be below a maximum packet efficiency to obtain a transport latency of a DAS below a DAS transport latency threshold level. Transport latency means a time to transport a packet between two components, for example, of a DAS (e.g., a donor interface and an access point). DAS transport latency has to be below a DAS transport latency threshold level so that total system latency (of which DAS transport latency is a component) between user equipment and an RF base station donor (or base station), which is part of the system and is communicatively coupled to the DAS, is less than a system transport threshold level to permit proper operation in a system utilizing time domain duplexing. Finally, the data throughput of the DAS may be, for example, 200 Gbps.

[1] Optionally, 6.144 Msps is selected for because it is integer divisible into a rate of data, 245.76 Mbps transmitted or received at an antenna of an access point of the DAS. As a result, decimation in the donor interface and interpolation in the access point is more efficient.

[2] A packet comprises payload data and non-payload data. The non-payload data size remains constant notwithstanding variations in payload data size. Thus, packet efficiency varies only with payload data size.

To attain the sampling rates discussed above, fractional resampling techniques may be employed. A single reconfigurable resampler, e.g., reconfigurable by programmable logic circuitry, or a set of fixed resamplers, e.g., implemented in programmable logic circuitry, may be used. Based on a carrier bandwidth, and thus, a sample rate, the reconfigurable resampler is configured to provide the sample rate or a resampler, of the set of fixed resamplers, is selected to provide the sample rate. Optionally, the programmable logic circuitry may be implemented with a field programmable gate array (FPGA).

Moreover, in some embodiments, "partial reconfiguration" in programmable logic circuitry can be used for the fractional resamplers. It can be complex and expensive to implement a filter that can achieve a programmable N/D type ratio that can be adjusted on the fly. Alternatively, in one embodiment, a highly optimized filter structure can be loaded in a "design partition", of programmable logic circuitry, that is allocated for the filters. Programmable logic circuitry, such as an FPGA, has a technology whereby one can assign a part of the programmable logic to a partition. The contents of these partitions can be loaded with a different design at run-time without programming the entire device. In fact, the rest of the programmable logic circuitry remains operating while a new partition is being loaded. That is, each resampling filter (for an associated carrier bandwidth) is stored in memory and loaded into the programmable logic circuitry for the selected carrier bandwidth. In such an embodiment, an optimal signal processing resampler is supported that can support run-time changes of the ratio N/D.

In general, there is a three-way relationship between: packet size (or fronthaul efficiency), latency (time per packet), and carrier bandwidth (BW). In the exemplary embodiment described here, a fixed latency is used. Packet size is a function of a variable application layer payload size. That is, packet size can be expressed by the following relationship:

packet size=latency*carrier bandwidth

When latency is fixed, the packet size varies as a function of carrier bandwidth. By doing this, the fixed latency does not depend on carrier bandwidth. The fixed latency is a latency which is deemed acceptable for system, i.e., including a DAS and a base station performance. Thus, an amount of data placed in a packet is determined based upon the carrier bandwidth so to provide the fixed latency. Thus, by increasing carrier bandwidth, application layer payload size (and thus packet size) and packet efficiency is increased; when decreasing carrier bandwidth, application payload size (and thus packet size) and packet efficiency is decreased.

In this exemplary embodiment using a fixed latency, a base time unit is defined as a "Jiffy" and is 1/n Hz, where n is an integer. Jiffy may also be referred to herein as a 'fixed time interval'. As a result, there are n Jiffys in total in a period of one second. Optionally, n equals 768,000 so that there are 768,000 Jiffys and one Jiffy is equivalent to a period of time that is 1/768 Khz or about 1.30 microseconds (us); alternatively, n may be another integer value. A Jiffy of 1/768 Khz is illustrated because integer multiples of 6.114 Msps divided by 768 Khz result in integer multiples of 8 I/O samples. Data is sent every Jiffy. In this exemplary embodiment of a fixed latency approach, the minimum data unit is defined as a "block". In this example, for a 5 megahertz (MHz) carrier, 6.144 Msps divided by 768 MHz equals 8 IQ samples per 5 MHz carrier. If each sample comprises a m-bit IQ sample (that is, for each sample, there is a m-bit "I" value and a m-bit "Q" value), then, for each Jiffy, there will be P IQ samples, each comprising a respective m-bit I value and a respective m-bit Q value, for each 5 MHz of bandwidth. As a result, for each Jiffy, there will be R bytes for each 5 MHz of bandwidth (that is, P samples per 5 MHz of bandwidth times R bits per sample divided by 8 bits per byte). This is defined as the minimum data unit and is referred to here as a "block." M, P, and R are each integer values. Optionally, m equals twelve, P equals eight, and R equals twenty four; however, other integer values may be selected for one or more of m, P and R.

Therefore, the amount of data that needs to be communicated in one direction (downlink or uplink) for each Jiffy for a given carrier is a function of the number of antenna ports used and the amount of carrier bandwidth. In the example described here, for a carrier bandwidth of 5 MHz and Single-Input-Single-Output (SISO) (that is, for a single antenna port in each direction), one "block" of data is communicated in each direction during each Jiffy. For a carrier bandwidth of 5 MHz and 2×2 Multiple-Input-Multiple-Output (MIMO) (that is, for two antenna ports in each direction), two blocks of data are communicated in each direction during each Jiffy. For a carrier bandwidth of 5 MHz and 4×4 MIMO (that is, for four antenna ports in each direction), four blocks of data are communicated in each direction during each Jiffy. Table I illustrates one embodiment of a number of blocks communicated in each direction during each Jiffy for SISO, 2×2 MIMO, and 4×4 MIMO configurations for various carrier bandwidths (BW) (using exemplary sample rates that are multiples of 6.144 Msps). The exemplary Table I illustrated below is only one example. Other carrier bandwidths, sample rates, block sizes, and/or Jiffy sizes can be used.

TABLE I

| Carrier BW (MHz) | Sample Rate (Msps) | SISO | 2 × 2 | 4 × 4 |
|---|---|---|---|---|
| 5 | 6.144 | 1 | 2 | 4 |
| 10 | 12.288 | 2 | 4 | 8 |
| 15 | 24.576 | 4 | 8 | 16 |
| 20 | 24.576 | 4 | 8 | 16 |
| 40 | 49.152 | 8 | 16 | 32 |
| 100 | 122.88 | 20 | 40 | 80 |

Figure 5:
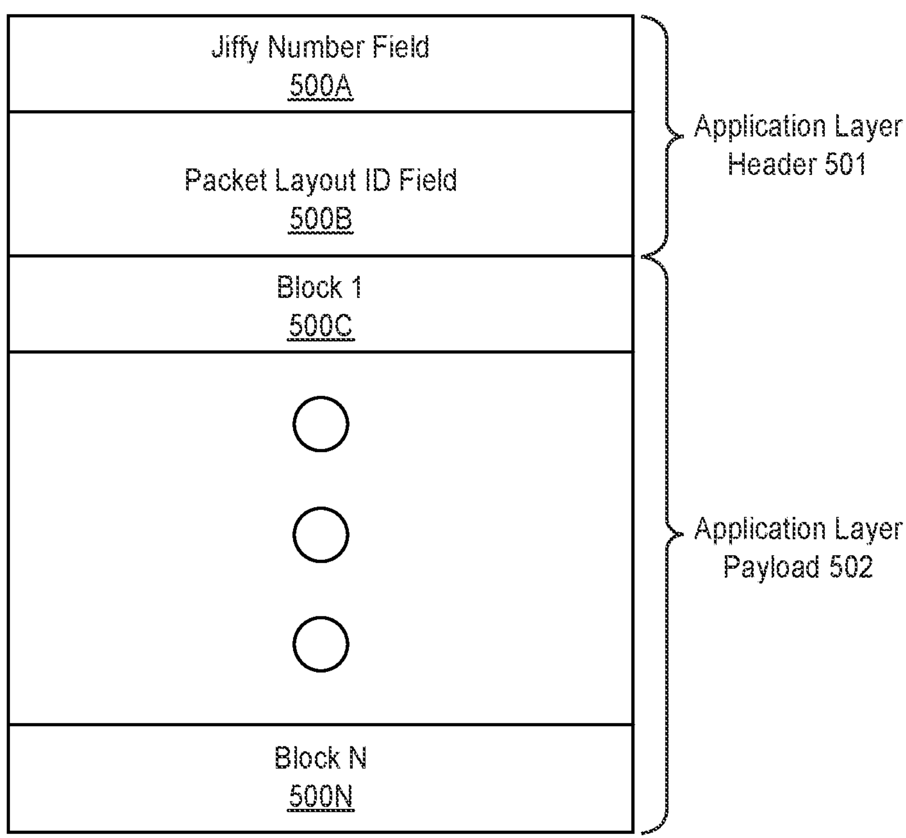
FIG. 5 illustrates a diagram of an exemplary embodiment of a format of a packet.

FIG. 5 illustrates a diagram of an exemplary embodiment of a format of a packet 500 that can be used to form each packet (or data of an Ethernet frame). Each packet 500 includes an application layer header 501 and an application layer payload 502.

Again, as noted above, each packet is generated for a particular Jiffy. In this example, each packet includes a Jiffy number field 500A that identifies a number of a particular Jiffy (or fixed time interval) with which the packet is associated. For example, the Jiffy number field can have a value from 0-767999. The Jiffy number can start from zero on a pulse per second (PPS) edge. The next field is a packet layout Identifier (Layout ID) field 500B that identifies how the blocks communicated in that packet are laid out. Each block communicated in a packet is associated with a particular carrier and antenna port used with that carrier (also referred to here as a "carrier/antenna configuration" or "carrier/antenna end point"), and the packet layout ID field 500B contains a packet layout ID which identifies which carrier/antenna port configuration each of the blocks communicated in subsequent is associated with. Each packet layout ID and a corresponding layout can be assigned by software (for example, using management-plane functionality) to components of the DAS, e.g., a donor interface, an access point, a master unit, and/or an ICN. Upon receipt of such information, logic circuitry in a component of the DAS can use such information to create a packet for transmission or extract data from an application layer payload of a received packet. In the case of the former, an application layer payload of a packet corresponding to a layout of a packet layout ID is created and the packet layout ID is specified in the application layer header 501 of the packet 500. In the case of the latter, the packet layout ID, in the packet layout ID field 500B of an application layer header 501 of a received packet, can be extracted and used to identify carrier/antenna endpoint(s) for data in blocks 500C, 500N of an application layer payload 502 of the received packet. The N block 500C, 500N each are configured to store data, e.g., I and Q data or absolute data, wherein the data corresponds to a certain carrier and is configured to be provided to a specific antenna as discussed herein with respect to the Layout ID. The application layer header 501 includes the jiffy number field 500A (configured to contain a Jiffy number) and the packet layout ID field 500B (configured to contain a packet layout ID).

Each packet 500, i.e., the application layer payload 502, may include IQ data for one or more carrier/antenna configurations. One illustrative example is subsequently described; however, a packet may be used to transport data for other antenna/carrier configurations. A packet may be used to communicate data for six different carrier/antenna configurations. The first four carrier/antenna configurations involve a first carrier (C0), with a respective different carrier/antenna configuration for each of four antenna ports (A0, A1, A2, and A3) used with that first carrier (for example, to support 4×4 MIMO). That is, the resulting four carrier/antenna configurations are C0A0, C0A1, C0A2, and C0A3. Data, e.g., I and Q data or absolute data, for carrier/antenna configurations C0A0, C0A1, C0A2, and C0A3 are respectively conveyed in blocks 1-4 of the application layer payload 502. The other two carrier/antenna configurations involve a second carrier (C1), with a respective different carrier/antenna configuration for each of two antenna ports (A0 and A1) used with that second carrier (for example, to support 2×2 MIMO). That is, the resulting two carrier/antenna carrier configurations are C1A0 and C1A1. I and Q data or absolute data for carrier/antenna configurations C1A0 and C1A1 are respectively conveyed in blocks 5 and 6 of the application layer payload 502. In the foregoing example, N equals 6. A carrier with fewer blocks, e.g., the second carrier, has a higher bandwidth than a carrier with more blocks, e.g., the first carrier. As shown in this example, data for multiple carriers can be communicated in the same packets (to further improve fronthaul efficiency). Also, different carriers can be communicated using different packets (with different packet layout identifiers).

Figure 6:
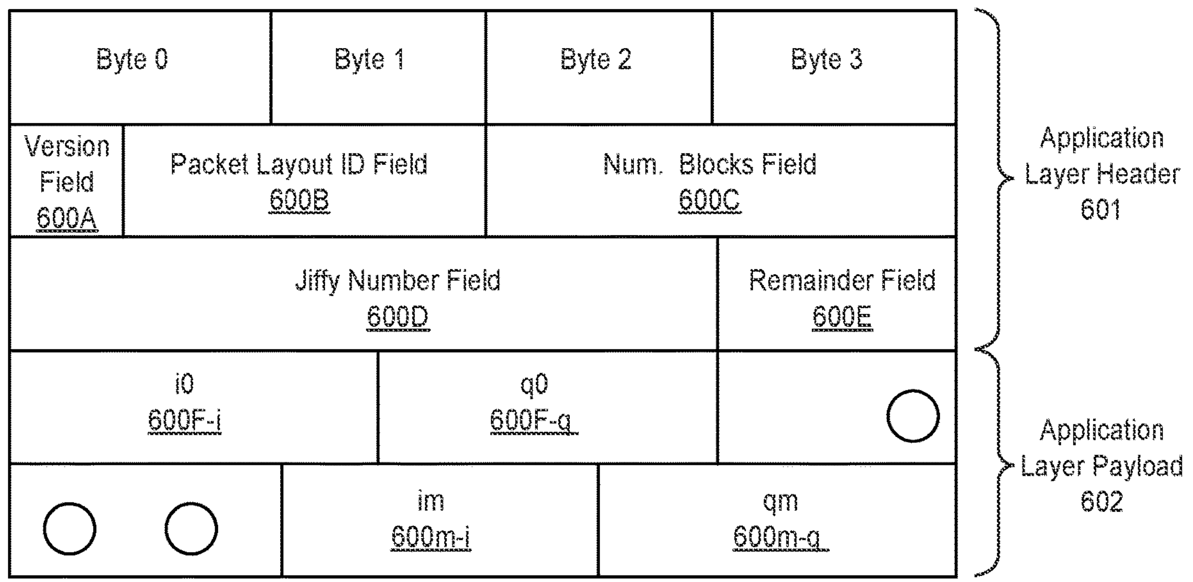
FIG. 6 illustrates a diagram of another exemplary embodiment of a format of a packet.

FIG. 6 illustrates a diagram of another exemplary embodiment of a format of a packet 600 that can be used to form each packet (or data of an Ethernet frame). Each packet 600 includes an application layer header 601 and an application layer payload 602. In the illustrated packet 600 the application layer header 601 is 8-bytes in length. In the illustrated embodiment, the application layer header 601 includes an optional version field 600A configured to specify an identifier of a packet format version. The illustrated application layer header 601 also includes a packet layout ID field 600B configured to specify an identifier of the layout of the packet as described elsewhere herein. Optionally, not all blocks of a packet 600 may contain data, e.g. I and Q data or absolute data; in such a case, the application layer header 601 optionally includes a number of blocks field 600C configured to specify a number of blocks, in the application layer payload 602, which contain data, e.g. I and Q data or absolute data. A value of the data number of blocks field 600C can be used to more efficiently process the packet 600 because data in this field is used by logic circuitry to identify padding blocks (which contain no data) that were added to the packet 600 to maintain a minimum packet size. The application layer header 601 includes a Jiffy Number field 600D configured to specify a value of a particular Jiffy number which is associated with the packet 600. The Jiffy number is described elsewhere herein. The Jiffy number can start from zero on a PPS edge. Optionally, the application layer header 601 also includes a remainder field 600E which is reserved for possible future use and/or vendor-specific/proprietary fields.

The application layer header 601 is followed by the application layer payload 602 including m blocks (configured to store real data) or 2*m blocks (configured to store IQ data). M is an integer greater than zero. FIG. 6 illustrates 2*m blocks of IQ data comprising block i0 600F-i, block q0 600F-q, block im 600*m-i*, and block qm 600*m-q*. The number of blocks may vary by packet. Optionally, each block of data comprises 12 bits or any other number of bits. The packet format described herein is easily parsed at high speeds by logic circuitry because it consists of a header of known length, e.g., eight bytes, followed by a known number of blocks, where each block has a fixed length, e.g., 24 bytes its. Speed is also enhanced because there are no headers in the middle of data as found in O-RAN compliant data packets.

The only limit on the bytes per cycle is an efficiency loss for packets that do contain sufficient payload data to fill an entire four-byte "line." In addition to the application layer header 601, each Ethernet frame includes additional overhead, i.e., application layer payload 602, including an Inter-frame Gap (IFG) and an Ethernet frame header including a preamble (indicating a start of a frame and permitting receiver synchronization), a destination media access control address (MAC) of a device to which the Ethernet frame is being sent, a source MAC address of a device which sends the Ethernet frame, a length of the Ethernet frame, and a frame check sequence, e.g., a cyclic redundancy check (CRC), used to detect whether there is an error in the packet. The Ethernet frame may include one or more optional fields, e.g., virtual local area network (VLAN) tag(s) each of which is configured to identify a specific logical LAN. Optionally, such overhead per Ethernet frame is 42 bytes in total but could be a different data length.

Optionally, there is one IQ sample per block; each block comprises 24 bits (or 3 bytes) per IQ sample. However, in other embodiments, these figures may differ, and/or an absolute sample may be conveyed in each block.

Transporting of a sequence (or a stream) of IQ samples having composite sample rate R samples/second, over an Ethernet link having available capacity C bits/second is considered, where each IQ sample is represented with b bits. The stream is a composite of the streams associated with one or more RF carriers, and R is a sample rate proportional to the sum of the RF bandwidths across the carriers. The composite sequence (or stream) is partitioned into blocks of N payload bits, and a header of size H bits is prepended to each block before transport of this size N+H bit packet over the Ethernet link. The latency, L, associated with the transport of a packet (also referred to as the packet formation time or the jiffy time) is:

$$L=N/(b*R)\text{(seconds)}$$

The transport rate required on the Ethernet link for the packetized stream is:

$$b*R*(H+N)/N,$$

and this must not exceed the available link capacity C, i.e., is constrained by:

$$b*R*(H+N)/N\ C,$$

or equivalently:

$$N'=b*R*H/(C-bR)$$

Given the header size H and the composite sample rate b*R, note that latency is minimized while satisfying the constraint by selecting:

$$N'=bRH/(C-bR)$$

for the payload block size, and the associated minimum latency, Lmin, is:

$$L\ \min=H/(C-bR)$$

Thus, the payload block size N' is used to minimize the latency (in uplink and/or downlink paths in an Ethernet link) for a given b*R, C, and H. The composite sample rate, b*R, is proportional/equivalent to carrier bandwidth (or composite carrier bandwidth) described herein.

For a maximum acceptable latency, payload block size can be selected to minimize consumption of available Ethernet link capacity. In other words, for a given header size H and a minimum acceptable latency, Lmin, a payload block size N" equal to L*b*R is selected to minimize consumption of the available Ethernet link capacity, (b*R*(H+N)/N)/C. Selection of such payload block size N" maximizes the carrier bandwidth (i.e., b*R) which can be supported, or alternatively if a lower carrier bandwidth is utilized, then provides a maximum amount of available link capacity, C, available for other uses.

Figure 4D:
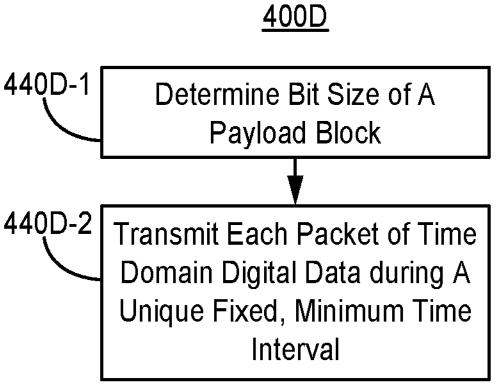
FIG. 4D illustrates a flow diagram of one embodiment of a method of diminishing latency in an uplink or a downlink path of a DAS.

FIG. 4D illustrates a flow diagram of one embodiment of a method 400D of diminishing latency in an uplink or a downlink path of a DAS. For purposes of clarity, method 400D may be implemented in both the uplink path and the downlink path of the DAS. Optionally, method 400D may be implemented in all or some of the DASs described with respect to one or more of FIGS. 1A-1E, and/or in other DAS implementations.

The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440D-1, a bit size, N', of a payload block of each packet is determined. Optionally, the bit size, N', of a payload block of each packet is determined as described elsewhere herein. Optionally, block 440D-1 may be implemented by any component of a DAS or by a component external to the DAS.

In block 440D-2, each packet of time-domain digital data is transmitted in an uplink path or a downlink path of the DAS during a unique fixed, minimum time interval. Each packet has a payload block size of N' and an application layer header bit size of H. Optionally, block 440D-2 may be implemented by a donor interface or a master unit for downlink time-domain data or by each RU in for uplink time-domain data.

Figure 4E:
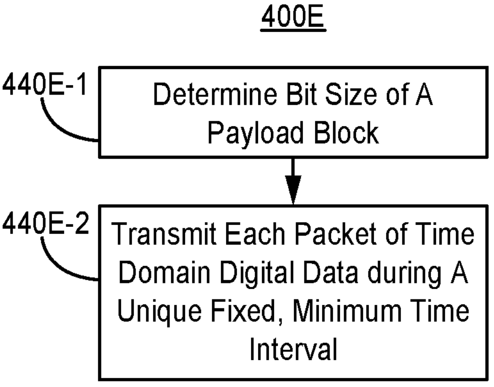
FIG. 4E illustrates a flow diagram of one embodiment of a method of reducing consumption of capacity of an Ethernet link in an uplink and/or a downlink path of a DAS.

FIG. 4E illustrates a flow diagram of one embodiment of a method 400E of reducing consumption of capacity of an Ethernet link in an uplink and/or a downlink path of a DAS. For purposes of clarity, method 400E may be implemented in both the uplink path and the downlink path of the DAS. Optionally, method 400E may be implemented in all or some of the DASs described with respect to one or more of FIGS. 1A-1E, and/or in other DAS implementations.

The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440E-1, a bit size, N", of a payload block of each packet is determined using a minimum acceptable latency. Optionally, the bit size, N", of a payload block of each packet is determined as described elsewhere herein. Optionally, block 440E-1 may be implemented by any component of a DAS or by a component external to the DAS.

In block 440E-2, each packet of time-domain digital data is transmitted in an uplink path or a downlink path of the DAS. Each packet has a payload block size of N" and an application layer header bit size of H to minimize capacity consumption in an Ethernet link in the downlink and/or uplink paths. Optionally, block 440E-2 may be implemented by a donor interface or a master unit for downlink time-domain data or by each RU in for uplink time-domain data.

Figure 7:
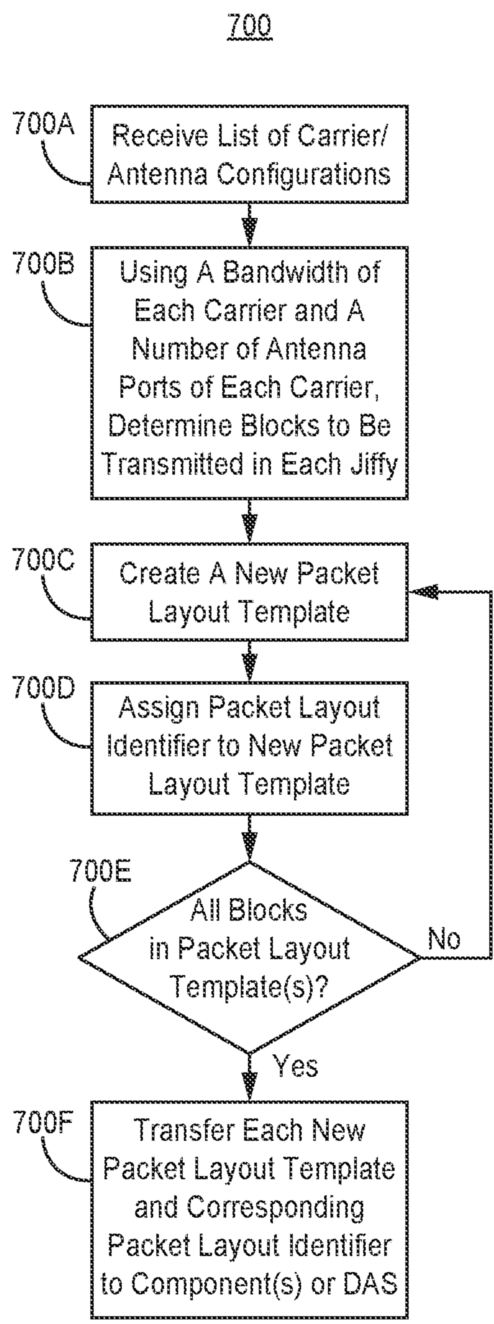
FIG. 7 illustrates a flow chart of an exemplary embodiment of a method illustrating construction of a packet layout.

FIG. 7 illustrates a flow chart of one embodiment of a method 700 illustrating construction of a packet layout. The method 700 may be performed for each stream of data conveyed with Ethernet frames between two DAS components. Each DAS component may be, for example, a donor interface, a master unit, an ICN, or an access point. Optionally, the method is performed by the DAS component configured to transmit the stream of data; however, all or part of the method may be performed by another device, e.g., another component, of the DAS or by device external to the DAS.

Optionally, method 700 may be performed at configuration time and/or using the management plane). Multiple carriers can be supported, but in some embodiments, this is avoided.

Optionally, the flow diagram of FIG. 7 may be implemented with all or some of the techniques described with respect to one or more of FIGS. 1A-6. The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 700A, a list of carrier/antenna configurations (and a bandwidth of each carrier), whose data is configured to be transmitted from a first component of a DAS to a second component of a DAS, is received. In block 700B, using a bandwidth of each carrier and a number of antenna ports of each carrier, a number of blocks of data (e.g., I or Q data), configured to be transmitted during each Jiffy, is determined. In block 700C, utilizing the number of blocks, a new packet layout template is create including at least one block, where a number of blocks is chosen not to exceed a maximum transmission unit (MTU) level or a number of blocks so that there are no remaining blocks to place in the new packet layout template. Optionally, MTU level is specified in eight bit bytes; however, another measure can be alternatively used. In block 700D, a unique packet layout identifier is assigned to the new packet layout template. In block 700E, whether all blocks have been included in at least one packet layout template is determined.

If not all blocks have been included in at least one packet layout template, then proceed to block 700C. If all blocks have been included in at least one packet layout template, then in block 700F, transfer each new packet layout template and corresponding packet layout identifier to each component of the DAS configured to at least one of: construct packets according to each packet layout template and to extract the data from each packet formed according to a packet layout template.

Figure 8:
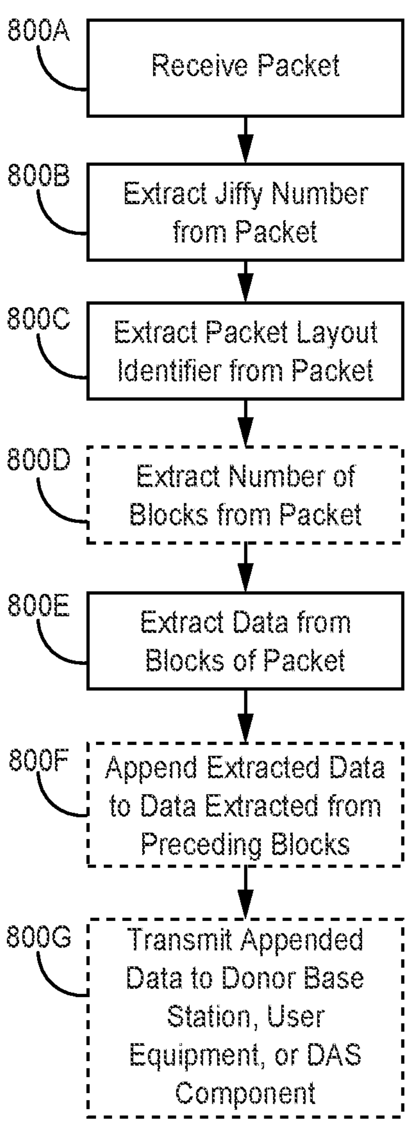
FIG. 8 illustrates a flow chart illustrating one embodiment of a method of extracting data from a packet.

FIG. 8 illustrates a flow chart illustrating one embodiment of a method 800 of extracting data from a packet. The method 800 may be performed for each stream of data conveyed with Ethernet frames between two DAS components. Each DAS component may be, for example, a donor interface, a master unit, an ICN, or an access point. Optionally, the method is performed by the DAS component configured to receive the stream of data; however, all or part of the method may be performed by another device, e.g., another component, of the DAS or by device external to the DAS. Multiple carriers can be supported, but in some embodiments, this is avoided.

Optionally, the flow diagram of FIG. 8 may be implemented with all or some of the techniques described with respect to one or more of FIGS. 1A-7. The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 800A, a packet (or an Ethernet frame comprising a payload that is the packet) is received by a component of the DAS. In block 800B, a Jiffy number, or time interval identifier, is extracted from the packet (or the Ethernet frame comprising a payload that is the packet). In block 800C, a packet layout identifier is extracted from the packet (or an Ethernet frame comprising a payload that is the packet). Optionally, in block 800D, a number of blocks containing data is extracted from the packet (or an Ethernet frame comprising a payload that is the packet). In block 800E, using the packet layout identifier, data is extracted from the blocks of the packet and each block of extracted data is assigned to a carrier-antenna port based upon the packet layout identifier. Optionally, the number of blocks is utilized so that data is only extracted from blocks containing data, i.e., actual data. The extracted data is then processed as described above. Optionally, in block 800F, the extracted data is appended to data extracted from preceding blocks. Optionally, in block 800G, appended data is transmitted to the donor base station, user equipment or a DAS component.

The following embodiment illustrates an example of formation of packet layout templates. In this embodiment, a first carrier/antenna configurations of 4×4 MIMO (with a first carrier having a 200 MHz bandwidth supporting 4×4 MIMO) and a second carrier/antenna configuration of 2×2 MIMO (with a second carrier having a 40 MHz bandwidth) are communicated each Jiffy. In this embodiment, 160 blocks in total (and 40 blocks for each antenna end point AP0, AP1, AP2, and AP3) are communicated for the first carrier for each Jiffy to support 4 carrier/antenna configurations, and 16 blocks in total (and 8 blocks for each antenna end point AP0' and AP1') are communicated for the second carrier each Jiffy to support 2 carrier/antenna configurations.

Then, the packets are formed based on block boundaries; that is a single block must be contained in one packet. In an example where an MTU level is 1500, then 60 blocks can be contained and communicated in each packet; however, a different MTU level may be used.

Figure 9:
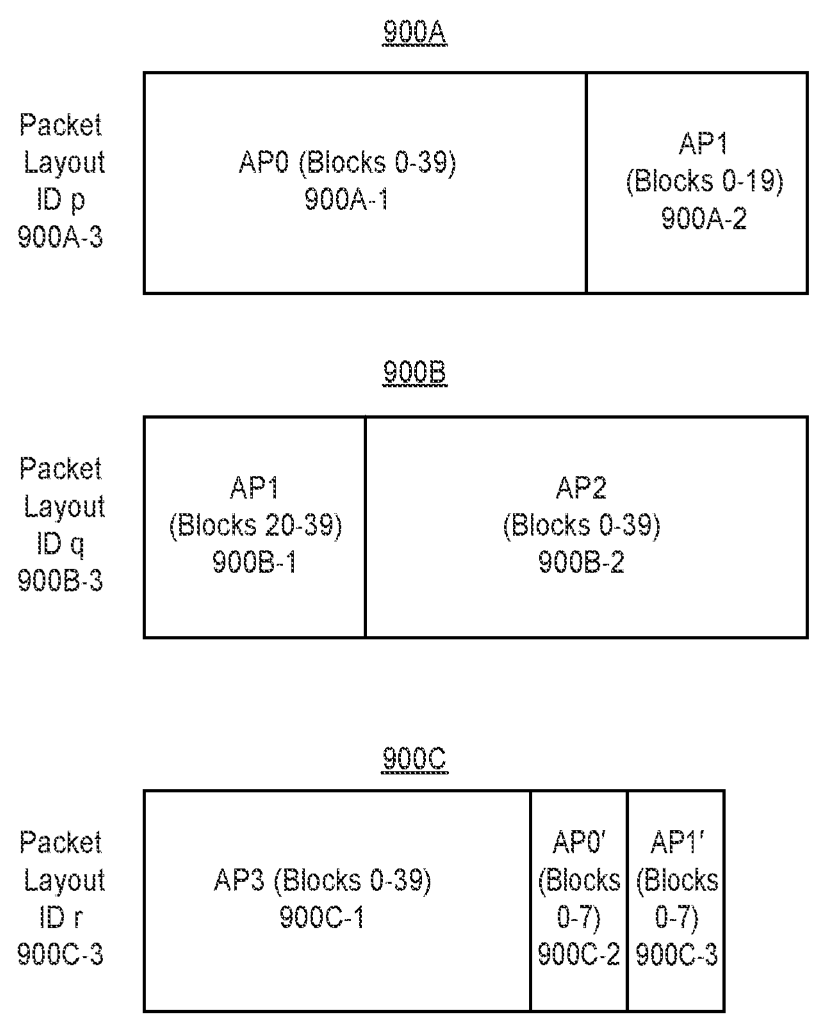
FIG. 9 illustrates diagrams of embodiments of three packet layouts.

FIG. 9 illustrates diagrams of embodiments of three packet layouts derived the embodiment described above. Three different packets are needed to communicate the 176 blocks (160 blocks for the first carrier/antenna configuration and 16 blocks for the second carrier/antenna configuration) each Jiffy. Packets can be formed using the packet layouts described below. A first packet layout 900A (assigned a packet layout ID p 900A-3) includes the forty blocks (0-39) of the first carrier/antenna end point (AP0) 900A-1 and the first twenty blocks (0-19) of the second carrier/antenna end point (AP1) 900A-2. The second packet layout (assigned packet layout ID q 900B-3) includes a second twenty blocks (20-39) of the second carrier/antenna end point (AP1) 900B-1 and forty blocks (0-39) of the third carrier/antenna end point (AP2) 900B-2. The third packet layout (assigned packet layout ID r 900C-3) includes forty blocks (0-39) of the fourth carrier/antenna end point (AP2), eight blocks (8) of the fifth carrier/antenna end point (AP0), and the eight blocks (8) for the sixth carrier/antenna end point (AP1).

Table II illustrates one embodiment of a number of blocks communicated in each direction during each Jiffy, Ethernet frame efficiency (Efficiency (Ethernet)), and IP packet efficiency (Efficiency (Ipv6) for various carrier bandwidths (BW) for a 2×2 MIMO configuration and various carrier bandwidths (BW).

TABLE II

| BW (MHz) | MIMO | Blocks | Payload | Packet Size (Inc IFG + preamble) | FH BW (Gbps) | Efficiency (Ethernet) | Efficiency (IPv6) |
|---|---|---|---|---|---|---|---|
| 5 | 2 × 2 | 2 | 48 | 98 | 0.6 | 48% | 33% |
| 10 | 2 × 2 | 4 | 96 | 146 | 0.89 | 66% | 49% |
| 15 | 2 × 2 | 8 | 192 | 242 | 1.49 | 79% | 66% |
| 20 | 2 × 2 | 8 | 192 | 242 | 1.49 | 79% | 66% |
| 100 | 2 × 2 | 40 | 960 | 1010 | 6.2 | 95% | 91% |

The exemplary Table II illustrated above is only one example. Other carrier bandwidths, sample rates, block sizes, overhead byte sizes, and/or Jiffy sizes can be used.

Table III illustrates one embodiment of a tradeoff between latency and bandwidth with such an approach (assuming 3 carriers per packet on average and no Ipv6). However, jiffy sizes, sample rates, and/or block sizes, different from those illustrated in Table III, can be used.

TABLE III

| Sample Rate (Msps) | Block Size (Samples) | Jiffys/ second | Jiffy Length (μs) | Overhead per stream (Mbps) | US Use case (Gbps) | EMEA Use case (Gbps) |
|---|---|---|---|---|---|---|
| 6.144 | 8 | 768000 | 1.3 | 102.4 | 23.97 | 24.82 |
| 6.144 | 12 | 512000 | 1.95 | 68.3 | 23.26 | 24.41 |
| 6.144 | 16 | 368000 | 2.6 | 49.1 | 21.94 | 23.2 |
| 7.68 | 8 | 960000 | 1.04 | 128 | 28.49 | 31.03 |
| 7.68 | 12 | 640000 | 1.56 | 85.3 | 27.6 | 30.52 |
| 7.68 | 16 | 480000 | 2.08 | 64 | 27.15 | 30.26 |

Table IV illustrates one embodiment of typical sample rates and efficient sample rates with respect to different carrier bandwidths. N is an integer representative of a number of 5 MHz that can be divided in a corresponding carrier bandwidth. D is 20 derived from dividing the 5 MHz into 100 MHz, e.g., a maximum carrier bandwidth specified in the 5G New Radio (NR) specifications. The efficient sample rate is a sample rate less than a typical sample rate, increases filter complexity and cost in signal processing implementations, and reduces a required link bandwidth.

TABLE IV

| Carrier Bandwidth (BW) (MHz) | Typical Sample Rate (Typical Fs) (Msps) | Sample Rate % of Nyquist (BW/(Fs/2) | N | D | Efficient Sample Rate (Efficient Fs) (Msps) = 122.88 * (N/D) | Ratio of Carrier Bandwidth/ Efficient Fs |
|---|---|---|---|---|---|---|
| 5 | 7.68 | 65.1 | 1 | 20 | 6.144 | 81.40% |
| 10 | 15.36 | 65.1 | 2 | 20 | 12.288 | 81.40% |
| 15 | 30.72 | 48.8 | 3 | 20 | 18.432 | 81.40% |
| 20 | 30.72 | 65.1 | 4 | 20 | 24.576 | 81.40% |
| 25 | 30.72 | 81.4 | 5 | 20 | 30.72 | 81.40% |
| 30 | 61.44 | 48.8 | 6 | 20 | 36.864 | 81.40% |
| 40 | 61.44 | 65.1 | 8 | 20 | 49.152 | 81.40% |
| 50 | 61.44 | 81.4 | 10 | 20 | 61.44 | 81.40% |
| 60 | 122.88 | 48.8 | 12 | 20 | 73.728 | 81.40% |
| 70 | 122.88 | 57 | 14 | 20 | 86.016 | 81.40% |
| 80 | 122.88 | 65.1 | 16 | 20 | 98.304 | 81.40% |
| 90 | 122.88 | 73.2 | 18 | 20 | 110.592 | 81.40% |
| 100 | 122.88 | 81.4 | 20 | 20 | 122.88 | 81.40% |

Another way to reduce latency in the fronthaul of a DAS is based on the following. One significant source of latency in the fronthaul switched Ethernet networks is queueing delay. When a split-8 packet arrives at a switch, if the switch is already sending a packet to a same port, e.g., of an access point or RU, then the split 8 packet will be delayed until that prior packet transfer has completed. If that prior packet is large (for example, an O-RAN frequency-domain data packet) and the link is slow (slow in this case meaning, for example, 10 Gbps) the delay can be quite significant (for example, 4+ microseconds). An improvement can be made by sending the other data inside of the split 8 packet, if they are coming from the same source.

For example, with an ICN between the RU and MU/RFD, rather than forwarding O-RAN traffic directly from the MU to the RU, the ICN can instead split the O-RAN packet up, putting a fragment of it at the end of each split-8 packet. Then, inside the RU, the O-RAN packet is reconstructed. In this way, the split 8 data stream can continue at a regular pace without interruption from other network traffic. The same process can be used on the uplink as well, with further latency benefits.

FIGS. 5-9 illustrate some ways to achieve higher efficiency sampling for optimizing fronthaul (FH) efficiency.

FIG. 5 shows the complete downlink path between the RFD and RU for an RF input. FIG. 6 similarly shows the DL path for a CPRI input. FIG. 7 shows the conventional way of doing the Digital Upconverter (DUC) for common sample rates using multiple stages of interpolate-by-2 filters. An optional embodiment achieves 81.4% but of course higher and lower efficiency sample rates could also be chosen depending on the design goals. It is a trade-off of computational load, delay, and FH efficiency.

Exemplary Embodiments

Example 1 includes a distributed antenna system (DAS) serving a base station, the distributed antenna system comprising: a donor card configured to couple the base station to the DAS and to communicate time-domain digital data therebetween; a plurality of radio units (RUs); and a switched Ethernet network coupling the plurality of RUs and the donor card; wherein the DAS is configured so that the time-domain digital data is communicated over the switched Ethernet network in packets having a fixed latency, wherein packet size varies as a function of carrier bandwidth.

Example 2 includes the DAS of Example 1, further comprising a master unit configured to couple the donor card to the plurality of radio units.

Example 3 includes the DAS of any of Examples 1-2, wherein a packet of the time-domain digital data is transmitted, over the switched Ethernet network, at each Jiffy, wherein a Jiffy is a fixed time interval.

Example 4 includes the DAS of Example 3, wherein the DAS is configured so that each of the packets comprises a Jiffy number field, a Layout Identifier field, a number of blocks field, and one or more blocks of the time-domain digital data, wherein a block is a minimum data unit of the time-domain digital data.

Example 5 includes the DAS of any of Examples 1-4, wherein each packet comprises at least one block which is a minimum data unit.

Example 6 includes the DAS of any of Examples 1-5, wherein the donor card and each of the plurality of RUs each comprise a fractional resampler supporting run-time changes of a re-sampling ratio based upon carrier bandwidth of data.

Example 7 includes the DAS of Example 6, wherein each fractional resampler comprises a reconfigurable resampler or a fixed number of resamplers, wherein the fixed number equals a number of possible carrier bandwidths.

Example 8 includes a distributed antenna system (DAS) serving a base station, the distributed antenna system comprising: a donor card configured to couple the base station to the DAS and to communicate time-domain digital data therebetween; and a plurality of radio units (RUs) coupled to the donor card via a switched Ethernet network; wherein at least one of the donor card and each of the plurality of RUs each comprise a fractional resampler supporting run-time changes of a re-sampling ratio based upon carrier bandwidth of data.

Example 9 includes the DAS of Example 8, wherein the fractional resampler is implemented using programmable logic circuitry, wherein multiple filter structures are stored in a design partition of the programmable logic circuitry.

Example 10 includes the DAS of any of Examples 8-9, wherein the donor card comprises one of a RF donor card configured to couple the base station to the DAS using an analog RF interface and a CPRI digital donor card configured to couple the base station to the DAS using an CPRI fronthaul interface.

Example 11 includes the DAS of any of Examples 8-10, further comprising a master unit configured to couple the donor card to the plurality of radio units.

Example 12 includes the DAS of any of Examples 8-11, wherein a packet of the time-domain digital data is transmitted, over the switched Ethernet network, at each Jiffy, wherein a Jiffy is a fixed time interval.

Example 13 includes the DAS of Example 12, wherein the DAS is configured so that each packet comprises a Jiffy number field, a Layout Identifier field, a number of blocks field, and one or more blocks of time-domain digital data, wherein a block is a minimum data unit of time-domain digital data.

Example 14 includes a distributed antenna system (DAS) serving a base station, the distributed antenna system comprising: a donor card configured to couple the base station to the DAS and to communicate time-domain digital data therebetween; a master unit configured to couple an open radio access network (O-RAN) distributed unit to the DAS and to communicate O-RAN data therebetween; at least one intermediate combining node (ICN); a plurality of radio units (RUs) coupled to the master unit through the ICN; a switched Ethernet network; and wherein the plurality of RUs, the master unit, ICN, and RUs are coupled to each other via the switched Ethernet network; wherein the ICN is configured to fragment the O-RAN data and combine fragments of the O-RAN data with the time-domain digital data and communicate the combined data to RUs.

Example 15 includes the DAS of Example 14, wherein a packet of the time-domain digital data is transmitted, over the switched Ethernet network, at each Jiffy, wherein a Jiffy is a fixed time interval.

Example 16 includes the DAS of Example 15, wherein the DAS is configured so that each packet comprises a Jiffy number field, a Layout Identifier field, a number of blocks field, and one or more blocks of the time-domain digital data, wherein a block is a minimum data unit of the time-domain digital data.

Example 17 includes the DAS of any of Examples 14-16, wherein the donor card and each of the plurality of RUs each comprise a fractional resampler supporting run-time changes of a re-sampling ratio based upon carrier bandwidth of data.

Example 18 includes the DAS of Example 17, wherein each fractional resampler comprises a reconfigurable resampler or a fixed number of resamplers, wherein the fixed number equals a number of possible carrier bandwidths.

Example 19 includes a method for defining a packet layout template, the method comprising: receiving a list of carrier-antenna configurations whose data is to be transmitted within a distributed antenna system (DAS), and a bandwidth of each carrier; determining a number of blocks of data of the packet layout template using the bandwidth of each carrier and a number of antenna ports of each carrier; using the number of blocks, creating the packet layout template including at least one block, wherein a number of the at least one block equals a maximum transmission unit (MTU) level or a number of blocks so that there are not remaining blocks to place in the packet layout template; assigning a unique packet layout identifier to the packet layout template; determining whether all blocks have been included in at least one packet layout template; and determining that all of the blocks have been included in the at least one packet layout template, then transferring each packet layout template and corresponding packet layout identifier to each component of the DAS configured to at least one of: construct packets according to each packet layout template and to extract the data from each packet formed according to a packet layout template.

Example 20 includes the method of Example 19, wherein the MTU level is specified in eight bit bytes.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

The invention claimed is:

1. A distributed antenna system (DAS) serving a base station, the distributed antenna system comprising:

a donor card configured to couple the base station to the DAS and to communicate base station signals therebetween;

a plurality of radio units (RUs); and a switched Ethernet network coupling the plurality of RUs and the donor card;

wherein the DAS is configured so that time-domain digital data, related to the base station signals, is communicated over the switched Ethernet network in packets having a fixed latency, wherein packet size varies as a function of carrier bandwidth associated with the base station signals.

2. The DAS of claim 1, further comprising a master unit configured to couple the donor card to the plurality of radio units.

3. The DAS of claim 1, wherein a packet of the time-domain digital data is transmitted, over the switched Ethernet network, at each Jiffy, wherein a Jiffy is a fixed time interval.

4. The DAS of claim 3, wherein the DAS is configured so that each of the packets comprises a Jiffy number field, a Layout Identifier field, a number of blocks field, and one or more blocks of the time-domain digital data, wherein a block is a minimum data unit of the time-domain digital data.

5. The DAS of claim 1, wherein each packet comprises at least one block which is a minimum data unit.

6. The DAS of claim 1, wherein the donor card and each of the plurality of RUs each comprise a fractional resampler supporting run-time changes of a re-sampling ratio based upon the carrier bandwidth of data.

7. The DAS of claim 6, wherein each fractional resampler comprises a reconfigurable resampler or a fixed number of resamplers, wherein the fixed number equals a number of possible carrier bandwidths.

8. A distributed antenna system (DAS) serving a base station, the distributed antenna system comprising:

a donor card configured to couple the base station to the DAS and to communicate base station signals therebetween; and a plurality of radio units (RUs) coupled to the donor card via a switched Ethernet network;

wherein at least one of the donor card and each of the plurality of RUs each comprise a fractional resampler supporting run-time changes of a re-sampling ratio based upon carrier bandwidth related to the base station signals.

9. The DAS of claim 8, wherein the fractional resampler is implemented using programmable logic circuitry, wherein multiple filter structures are stored in a design partition of the programmable logic circuitry.

10. The DAS of claim 8, wherein the donor card comprises one of a RF donor card configured to couple the base station to the DAS using an analog RF interface and a CPRI digital donor card configured to couple the base station to the DAS using an CPRI fronthaul interface.

11. The DAS of claim 8, further comprising a master unit configured to couple the donor card to the plurality of radio units.

12. The DAS of claim 8, wherein a packet of time-domain digital data, related to the base station signals, is transmitted, over the switched Ethernet network, at each Jiffy, wherein a Jiffy is a fixed time interval.

13. The DAS of claim 12, wherein the DAS is configured so that each packet comprises a Jiffy number field, a Layout Identifier field, a number of blocks field, and one or more blocks of the time-domain digital data, wherein a block is a minimum data unit of the time-domain digital data.

* * * * *